(12) United States Patent
Huang et al.

(10) Patent No.: US 11,038,054 B2
(45) Date of Patent: Jun. 15, 2021

(54) ASYMMETRIC SOURCE AND DRAIN STRUCTURES IN SEMICONDUCTOR DEVICES

(71) Applicant: Taiwan Semiconductor Manufacturing Co., Ltd., Hsinchu (TW)

(72) Inventors: Yu-Lien Huang, Jhubei (TW); Peng Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/569,773

(22) Filed: Sep. 13, 2019

(65) Prior Publication Data

US 2020/0006556 A1    Jan. 2, 2020

Related U.S. Application Data

(62) Division of application No. 15/880,465, filed on Jan. 25, 2018, now Pat. No. 10,510,883.

(Continued)

(51) Int. Cl.
| | |
|---|---|
| *H01L 21/8234* | (2006.01) |
| *H01L 29/78* | (2006.01) |
| *H01L 29/66* | (2006.01) |
| *H01L 21/768* | (2006.01) |
| *H01L 21/3065* | (2006.01) |

(Continued)

(52) U.S. Cl.
CPC ...... *H01L 29/7835* (2013.01); *H01L 21/0228* (2013.01); *H01L 21/02274* (2013.01); *H01L 21/3065* (2013.01); *H01L 21/311* (2013.01); *H01L 21/31116* (2013.01);

(Continued)

(58) Field of Classification Search
CPC ................ H01L 21/823431; H01L 21/823821
See application file for complete search history.

(56) References Cited

U.S. PATENT DOCUMENTS

| 5,376,234 A | 12/1994 | Yanagida |
|---|---|---|
| 7,923,784 B2 | 4/2011 | Chae et al. |

(Continued)

FOREIGN PATENT DOCUMENTS

| KR | 20160141034 A | 12/2016 |
|---|---|---|
| KR | 20170090996 A | 8/2017 |

*Primary Examiner* — George R Fourson, III
(74) *Attorney, Agent, or Firm* — Slater Matsil, LLP

(57) ABSTRACT

The present disclosure provides semiconductor devices with asymmetric source/drain structures. In one example, a semiconductor device includes a first group of source/drain structures on a first group of fin structures on a substrate, a second group of source/drain structures on a second group of fin structures on the substrate, and a first gate structure and a second gate structure over the first and the second group of fin structures, respectively, the first and second groups of source/drain structures being proximate the first and second gate structures, respectively, wherein the first group of source/drain structures on the first group of fin structures has a first source/drain structure having a first vertical height different from a second vertical height of a second source/drain structure of the second group of source/drain structures on the second group of fin structures.

20 Claims, 34 Drawing Sheets

Related U.S. Application Data

(60) Provisional application No. 62/591,265, filed on Nov. 28, 2017.

(51) Int. Cl.
   *H01L 21/02* (2006.01)
   *H01L 21/321* (2006.01)
   *H01L 21/311* (2006.01)

(52) U.S. Cl.
   CPC .... *H01L 21/3212* (2013.01); *H01L 21/76829* (2013.01); *H01L 29/6681* (2013.01); *H01L 29/66659* (2013.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,564,489 B2 | 2/2017 | Yeo et al. |
| 9,601,342 B2 | 3/2017 | Lee et al. |
| 9,608,116 B2 | 3/2017 | Ching et al. |
| 2012/0289050 A1 | 11/2012 | Wu et al. |
| 2014/0085966 A1 | 3/2014 | Song et al. |
| 2014/0252477 A1 | 9/2014 | Tseng et al. |
| 2015/0035023 A1 | 2/2015 | Kim et al. |
| 2015/0262827 A1 | 9/2015 | Khaderbad et al. |
| 2016/0351570 A1 | 12/2016 | Park et al. |
| 2017/0221906 A1 | 8/2017 | Lin et al. |
| 2017/0271462 A1 | 9/2017 | Kim et al. |
| 2018/0090583 A1 | 3/2018 | Choi et al. |
| 2018/0190810 A1 | 7/2018 | Li et al. |
| 2018/0286810 A1* | 10/2018 | You ................. H01L 29/41791 |
| 2018/0350821 A1 | 12/2018 | Lin et al. |

* cited by examiner

ASYMMETRIC SOURCE AND DRAIN STRUCTURES IN SEMICONDUCTOR DEVICES

PRIORITY CLAIM AND CROSS-REFERENCE

This application is a divisional of U.S. application Ser. No. 15/880,465, filed on Jan. 25, 2018, entitled "Asymmetric Source and Drain Structures in Semiconductor Devices," now U.S. Pat. No. 10,510,883, which claims the benefit of U.S. Provisional Application No. 62/591,265, filed on Nov. 28, 2017, each application is hereby incorporated herein by reference

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is forming a replacement-gate process (also called as a "gate-last" process) in which the final gate stack is fabricated "last". However, there are challenges to implement such IC fabrication processes in advanced process nodes. Inaccurate and improper control of the deposition and patterning process during the device structure fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
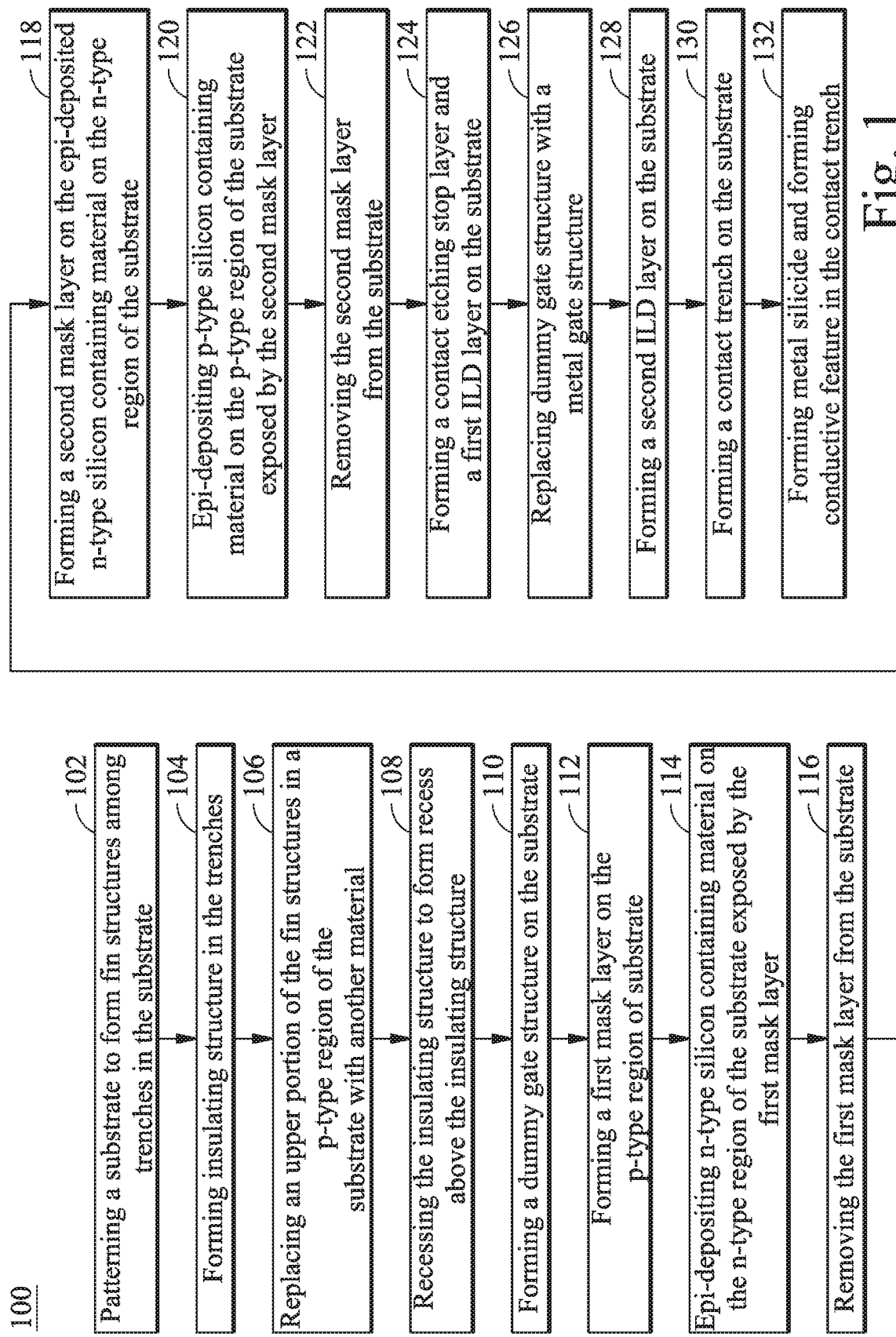
FIG. 1 is a flow chart of an exemplary process for manufacturing a device structure on a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gates formed in semiconductor devices. The present disclosure provides methods for forming source/drain structures with asymmetric profiles at different locations of the semiconductor device so as to engineer electrical performance of the semiconductor devices. In one example, the asymmetric profiles of the source/drain structures may be obtained by forming the source/drain structures with different dimensions and profiles. In another example, the asymmetric profiles of the source/drain structures may be obtained by patterning the source/drain structures using etchants with high selectivity so as to selectively trim and/or pattern the source/drain structures at different active regions with different patterning rates, rendering different resultant profiles of the source/drain structures at different locations after the patterning process. Asymmetric profiles of the source/drain structures allow different electrical performance in different active regions (e.g., p-type or n-type regions) of the semiconductor devices so as to provide a flexible engineering window for device electrical performance adjustment and alternation. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In a replacement gate process for forming a metal gate for a transistor, a dummy gate stack is formed over a substrate as a placeholder for an actual gate stack later formed thereon. A spacer structure is formed surrounding the dummy gate stack. After source/drain features are formed, a contact etch stop layer (CESL) and interlayer dielectric (ILD) layer are formed adjacent to the spacer structure, the dummy gate stack is removed, leaving an opening surrounded by the spacer structure, CESL and ILD layer. Then, a metal gate is formed in the opening defined by the spacer structure, CESL, and ILD.

The metal gate structure includes a gate dielectric layer, such as a high-k dielectric layer, an optional barrier layer, a work-function tuning layer, and a gate metal electrode. Multiple deposition and patterning processes may be used to form the work-function tuning layer, for example, to fine tune threshold voltage (Vt) of the transistor. In some embodiments, the work-function tuning layer may utilize different materials for different types of transistors, such as p-type FinFET or n-type FinFET, so as to enhance device electrical performance as needed. The barrier layer is optionally used to protect the gate dielectric layer during the patterning processes.

Figure 2:
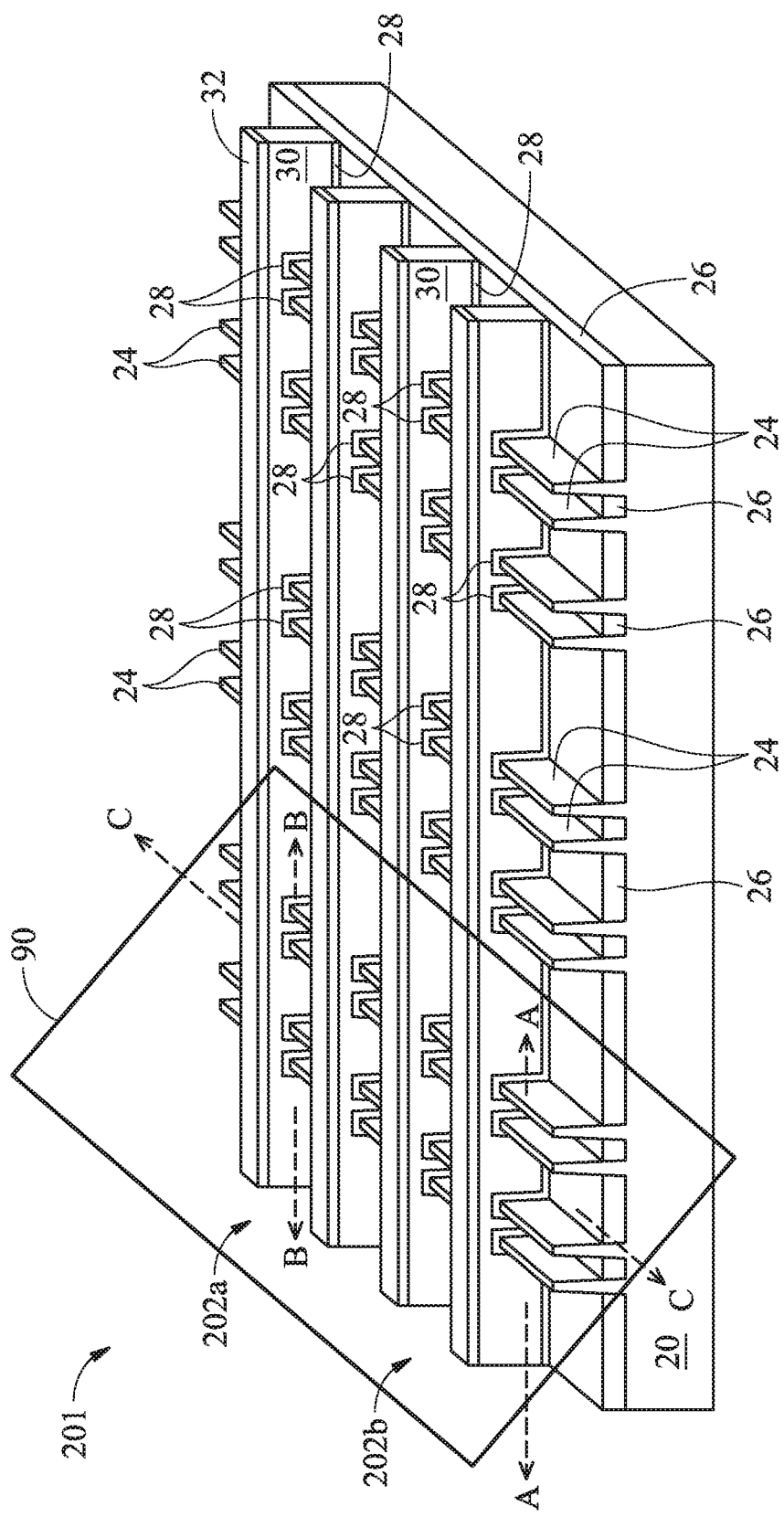
FIG. 2 depicts a perspective view of a semiconductor device structure in accordance with some embodiments.

FIG. 1 depicts an exemplary flow diagram of a process 100 performed to form a semiconductor device structure, such as a simplified semiconductor FinFET device structure 201 depicted in FIG. 2. Other aspects not illustrated in or described with respect to FIG. 2 may become apparent from the following figures and description. The structure in FIG. 2 may be electrically connected or coupled in a manner to operate as, for example, one transistor or more. FIGS. 3-19D are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2-19D or other semiconductor structures not presented herein.

The simplified FINFET device structure 201 depicted in FIG. 2 is formed on a substrate 20. The substrate 20 can be or include a bulk semiconductor substrate, a semiconductor-on-insulator (SOI) substrate, or another substrate. The semiconductor material of the substrate 20 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 20, the substrate 20 may include semiconductor material disposed on an insulator layer, which may be a buried insulator disposed in a semiconductor substrate, or which may be a glass or sapphire substrate. In embodiments depicted herein, the substrate 20 is a silicon containing material, such as a crystalline silicon substrate. Moreover, the substrate 20 is not limited to any particular size, shape, or materials. The substrate 20 may be a round/circular substrate having a 200 mm diameter, a 300 mm diameter, or other diameters, such as 450 mm, among others. The substrate 20 may also be any polygonal, square, rectangular, curved, or otherwise non-circular workpiece, such as a polygonal substrate as needed.

Each fin structure 24 provides an active region where one or more devices are formed. The fin structures 24 are fabricated using suitable processes including masking, photolithography, and/or etch processes. In an example, a mask layer is formed overlying the substrate 20. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 20 while an etch process forms recesses 25 in the substrate, leaving an extending fin, such as the fin structures 24. The recesses 25 may be etched using reactive ion etch (RIE) and/or other suitable processes. Numerous other embodiments of methods to form a fin structure on a substrate may be utilized.

In an embodiment, the fin structures 24 are approximately 10 nanometer (nm) wide and in a range from approximately 10 nm to 60 nm in height, such as about 50 nm high. However, it should be understood that other dimensions may be used for the fin structures 24. In one example, the fin structures 24 comprise a silicon material or another elementary semiconductor, such as germanium, or a compound semiconductor including silicon carbide, gallium arsenic, gallium phosphide, indium phosphide, indium arsenide, and/or indium antimonide. The fin structures 24 may also be an alloy semiconductor including SiGe, GaAsP, AlInAs, AlGaAs, GaInAs, GaInP, GaInAsP, or a combination thereof. Further, the fin structures 24 may be doped using n-type and/or p-type dopants as needed.

As described, in an example, the plurality of fin structures 24 may be formed by etching a portion of the substrate 20 away to form the recesses 25 in the substrate 20. The recesses 25 may then be filled with isolating material that is recessed or etched back to form isolation structures 26. Other fabrication techniques for the isolation structures 26 and/or the fin structure 24 are possible. The isolation structures 26 may isolate some regions of the substrate 20, e.g., active areas in the fin structures 24. In an example, the isolation structures 26 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers.

A dummy gate structure 50 is formed over the fin structures 24. In the example depicted in FIG. 2, the dummy gate structure 50 includes a gate dielectric layer 28, a gate electrode layer 30, and a hard mask 32. It is noted that the dummy gate structure 50 may further include a capping layer and/or other suitable layers. The various layers in the dummy gate structure 50 may be formed by suitable deposition techniques and patterned by suitable photolithography and etching techniques. The dummy gate structure 50 engages the fin structures 24 on two or three sides of the fin structure 24.

The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. The gate dielectric layer 28 can be a dielectric oxide layer. For example, the dielectric oxide layer may be formed by chemical oxidation, thermal oxidation, atomic layer deposition (ALD), chemical vapor deposition (CVD), and/or other suitable methods. The gate electrode layer 30 may be a poly-silicon layer or other suitable layers. For example, the gate electrode layer 30 may be formed by suitable deposition processes such as low-pressure chemical vapor deposition (LPCVD) and plasma-enhanced CVD (PECVD). The hard mask 32 may be any material suitable to pattern the dummy gate structure 50 with desired features/dimensions on the substrate.

In an embodiment, the various layers of the dummy gate structure 50 are first deposited as blanket layers. Then, the blanket layers are patterned through a process including photolithography and etching processes, removing portions of the blanket layers and keeping the remaining portions over the isolation structures 26 and the fin structures 24 to form the dummy gate structure 50.

In an example, the semiconductor device structure 201 includes a n-type region 202a and an p-type region 202b. One or more p-type devices, such as p-type FinFETs, may be formed in the n-type region 202a, and one or more n-type devices, such as n-type FinFETs, may be formed in the p-type region 202b. The semiconductor device structure 201 may be included in an IC such as a microprocessor, memory device, and/or other IC.

FIG. 2 illustrates a three-dimensional view of the semiconductor device structure 201. FIG. 2 also illustrates cross-sections A-A, B-B and C-C. FIGS. 4A-19A ending with an "A" designation illustrate cross-sectional views at various instances of processing stages of FIG. 1 corresponding to cross-section A-A. FIGS. 4B-19B ending with a "B" designation illustrate cross-sectional views at various instances of processing stages of FIG. 1 corresponding to cross-section B-B. FIGS. 4C-19C ending with a "C" designation illustrate cross-sectional views at various instances of processing stages of FIG. 1 corresponding to cross-section C-C. FIGS. 4D-19D ending with a "D" designation illustrate top views of a certain region of the semiconductor device structure 201, as indicated in an area 90 of FIG. 2, at various instances of processing stages of FIG. 1. The cross-section A-A and B-B are a cut-away plane perpendicular to an array of fin structures 24 (e.g., across source/drain regions of the fin structures 24) formed in the n-type region 202a and p-type region 202b respectively. The cross-section C-C is along a fin structure 24 (e.g., along a channel direction in the fin structure 24) through which a cut will be made in subsequent figures and description. Cross-sections A-A, B-B are perpendicular to cross-section C-C. In some figures, some reference numbers of components or features illustrated therein may be omitted to avoid obscuring other components or features; this is for ease of depicting the figures.

Figure 3:
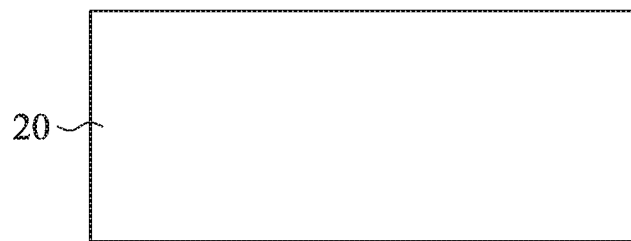
FIGS. 3, 4A-4D, 5A-5D, 6A-6D, 7A-7D, 8A-8D, 9A-9D, 10A-10D, 11A-11D, 12A-12D, 13A-13D, 14A-14D, 15A-15D, 16A-16D, 17A-17D, 18A-18D and 19A-19D depict cross-sectional views of the semiconductor device structure at different manufacturing stages of FIG. 1 in accordance with some embodiments.
Figure 4A:
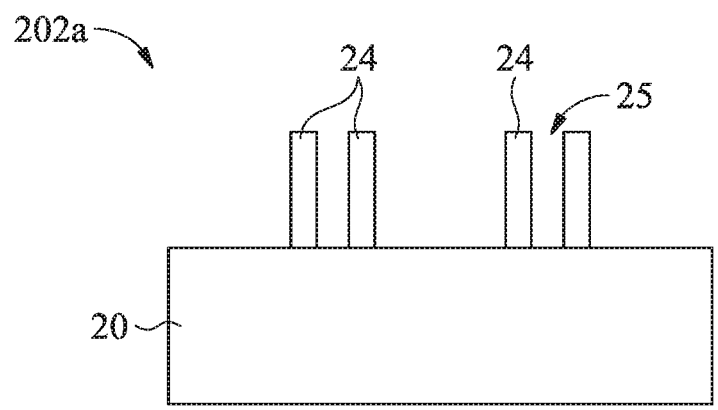
Figure 4B:
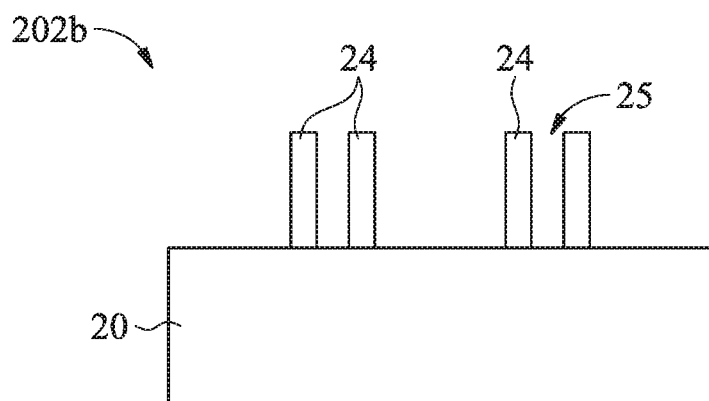
Figure 4C:
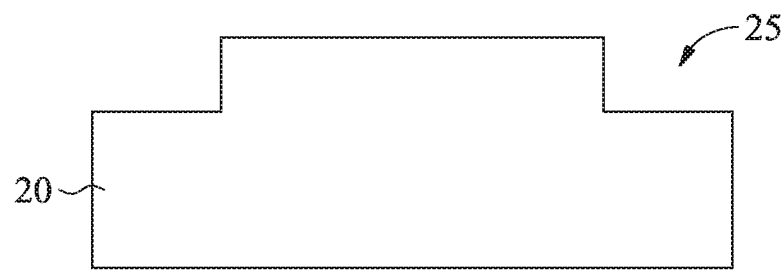
Figure 4D:
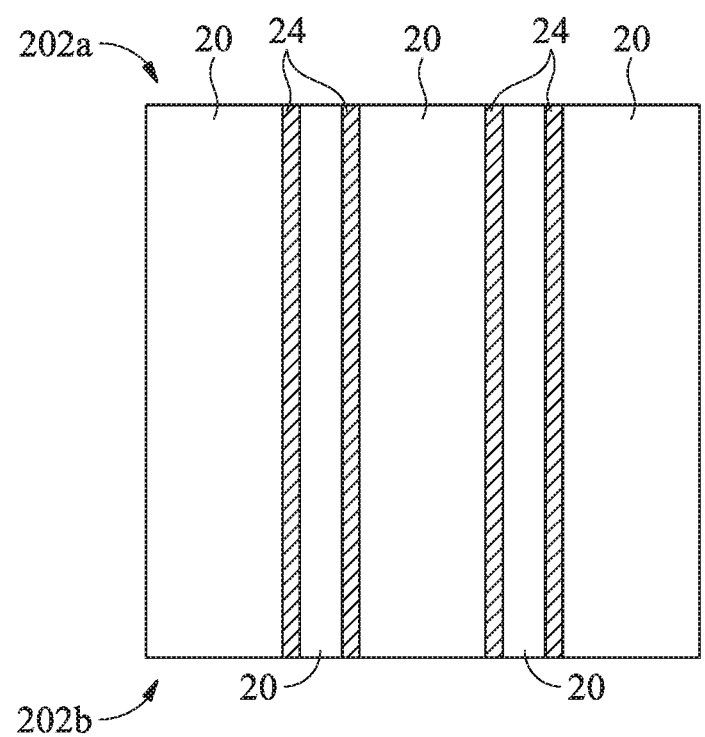
Figure 5A:
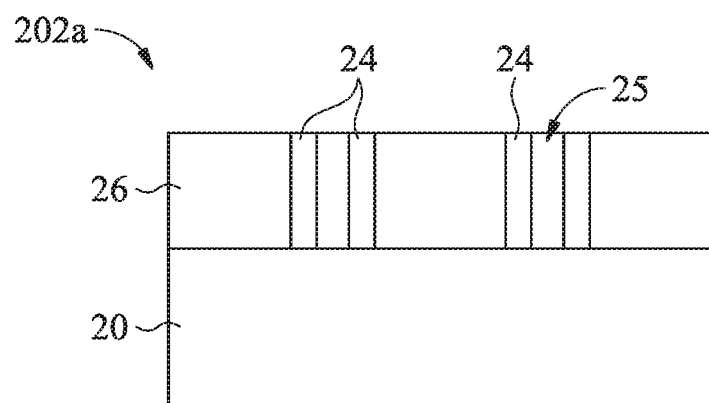
Figure 5B:
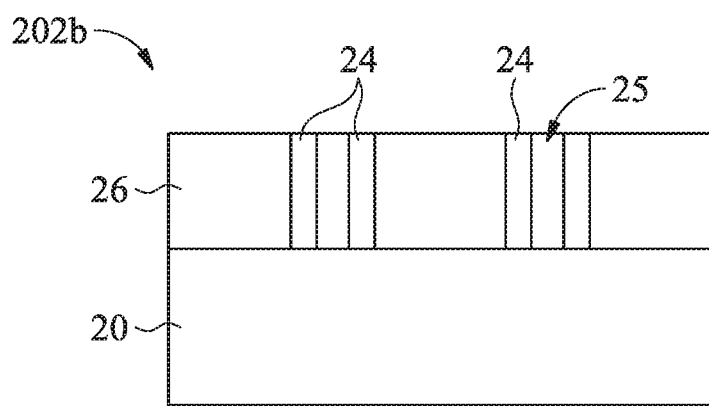
Figure 5C:
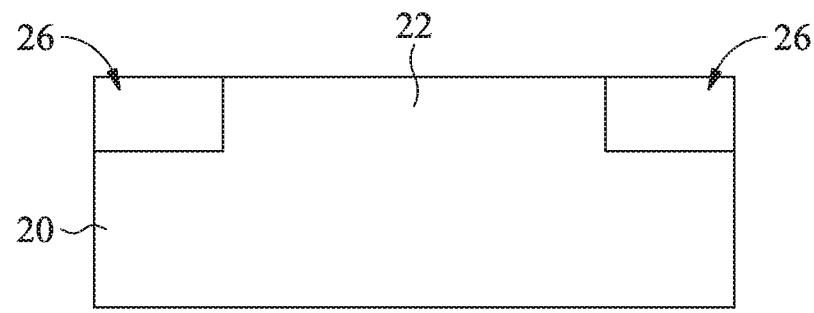
Figure 5D:
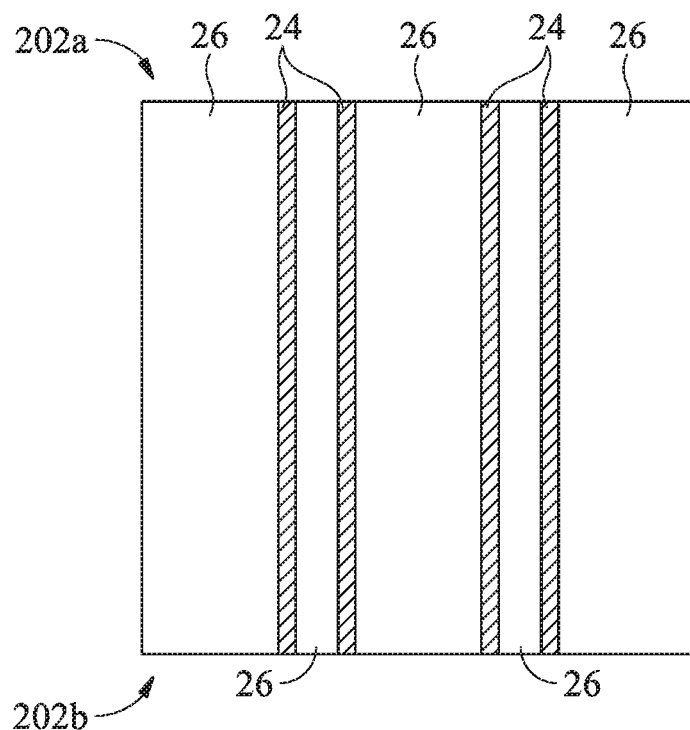
Figure 6A:
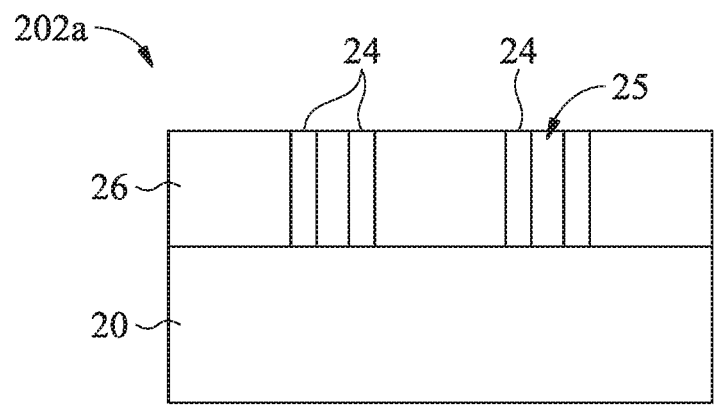
Figure 6B:
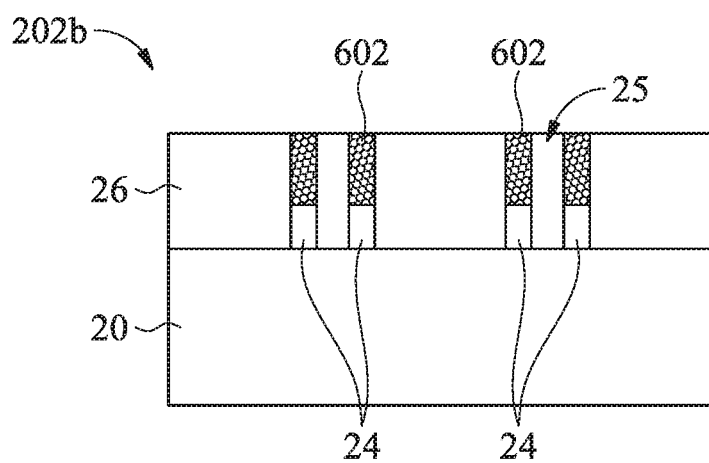
Figure 6C:
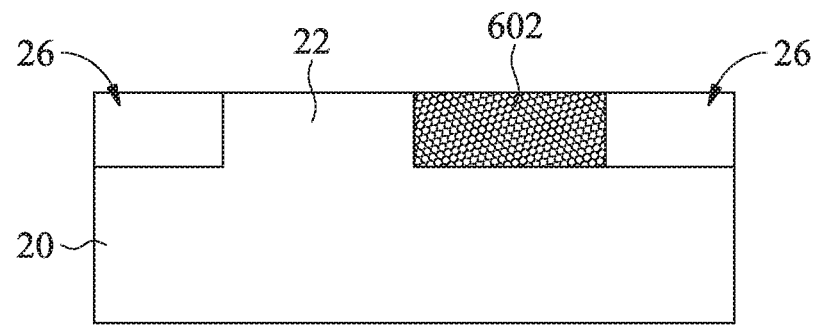
Figure 6D:
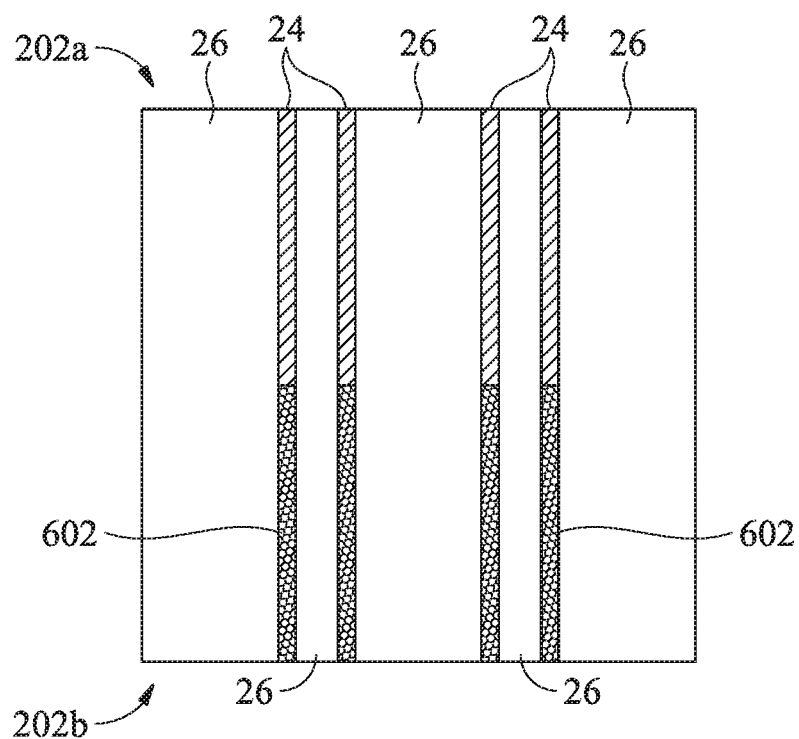
Figure 7A:
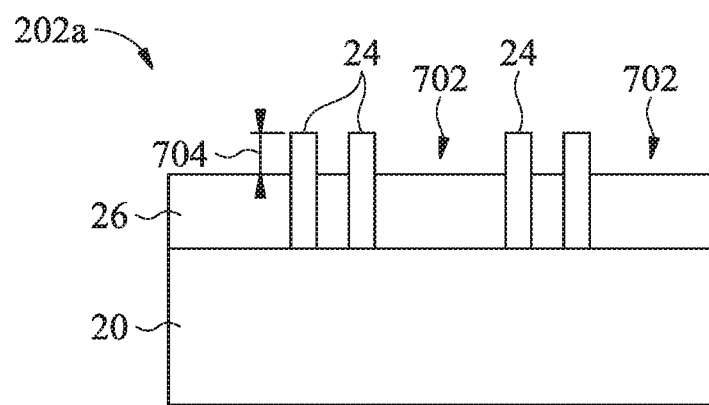
Figure 7B:
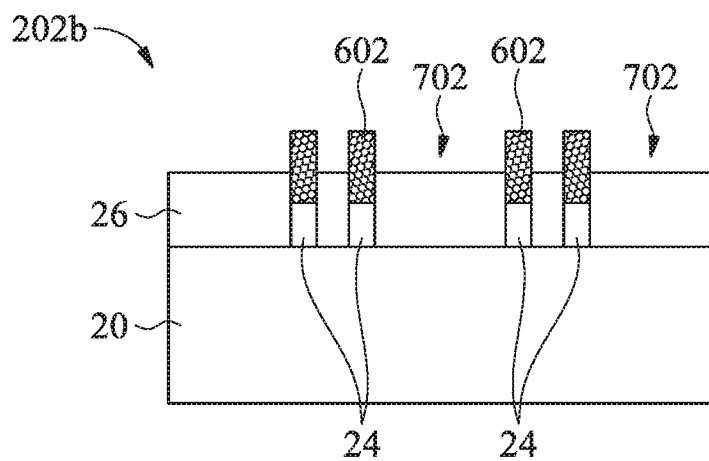
Figure 7C:
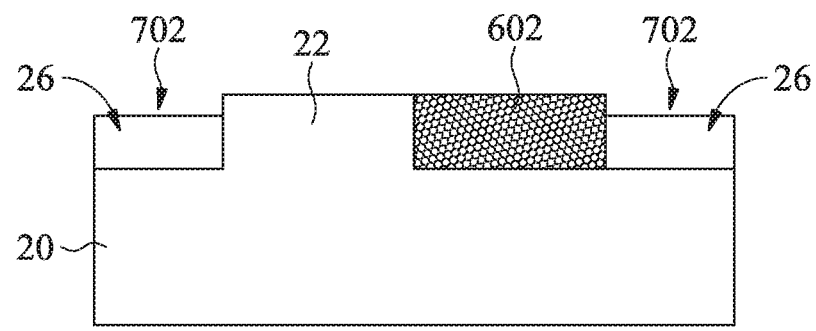
Figure 7D:
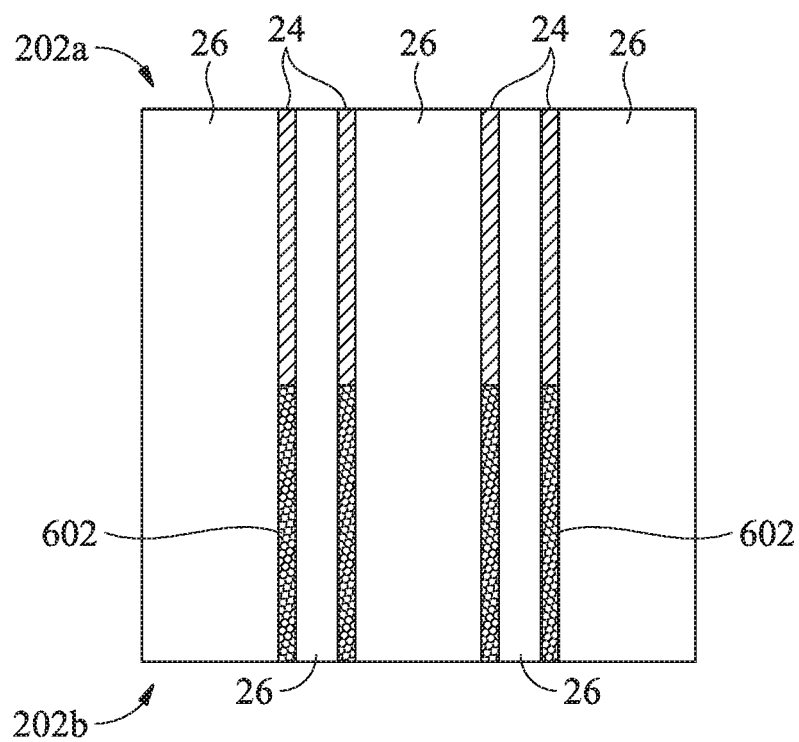

Referring back to the process 100 depicted in FIG. 1, the process 100 begins at operation 102 by patterning a substrate 20, as depicted in FIG. 3, to form fin structures 24, as shown in FIGS. 4A-4D, in the substrate 20. The patterning process is performed to form recesses 25 in the substrate 20 defining the fin structures 24 in the substrate 20, as shown in FIGS. 4A-4D. A mask (not shown) is used to facilitate forming the fin structures 24 in the substrate 20. For example, one or more mask layers are deposited over the substrate 20, and the one or more mask layers are then patterned into the mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

At operation 104, an isolation structure 26 is formed in each recess 25, as shown in FIGS. 5A-5D. The isolation structure 26 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation structure 26 includes silicon oxide that is formed by a FCVD process. A planarization process, such as a Chemical Mechanical Polish (CMP), may remove any excess insulating material and any remaining mask (e.g., used to etch the recess 25 and form the fin structures 24) to form top surfaces of the insulating material and top surfaces of the fin structures 24 to be substantially coplanar.

At operation 106, upper portions of the fin structures 24 in the p-type region 202b are removed and replaced with another material, as shown in FIGS. 6A-6D. In the example depicted herein, heteroepitaxial fin structures 602 may be formed by first etching upper portions of the fin structures 24 in the p-type region 202b away from the substrate 20 and, then, epitaxially depositing the heteroepitaxial fin structures 602. During the etching and epitaxial deposition, the n-type region 202a may be masked by a hard mask. For example, the fin structures 24 can be recessed, and a material different from the fin structure 24 is epitaxially grown where the fin structures 24 are recessed, forming the heteroepitaxial fin structures 602. The epitaxial grown materials may be in situ doped during growth, which may obviate implanting of the fins although in situ and implantation doping may be used together. In the example depicted herein, the heteroepitaxial fin structures 602 are epitaxially grown with a material for the p-type region 202b different from the material for the fin structure 24 in the n-type region 202a. After epitaxially growing the heteroepitaxial fin structures 602, a planarization process, such as a CMP, may be performed to remove the mask on the n-type region 202a and to planarize the fin structures 24, heteroepitaxial fins structures 602, and the isolation structures 26.

In one example, the heteroepitaxial fin structures 602 have a thickness between about 30 nm and about 100 nm.

In one example, the heteroepitaxial fin structures 602 may be silicon germanium ($Si_xGe_{1-x}$, where x can be between approximately 0 and 100), silicon carbide, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. In one specific example, the heteroepitaxial fin structures 602 include a SiGe material.

At operation 108, the insulation structures 26 are recessed to form recesses 702 above the insulation structures 26, as shown in FIGS. 7A-7D. The isolation structure 26 is recessed such that the fin structures 24 and the heteroepitaxial fin structures 602 protrude from between neighboring isolation structures 26, which may, at least in part, delineate the fin structures 24 and the heteroepitaxial fin structures 602 as active areas on the substrate 20. The isolation structures 26 may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation structure 26 may have a flat surface as illustrated, a convex surface, a concave surface (such as dishing), or a combination thereof, which may result from an etch process. In one example, the recess 702 has a depth 704 in a range from about 20 nm to about 60 nm.

Figure 8A:
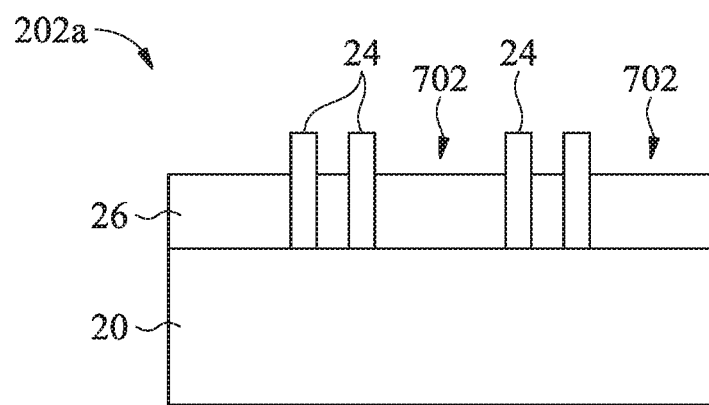
Figure 8B:
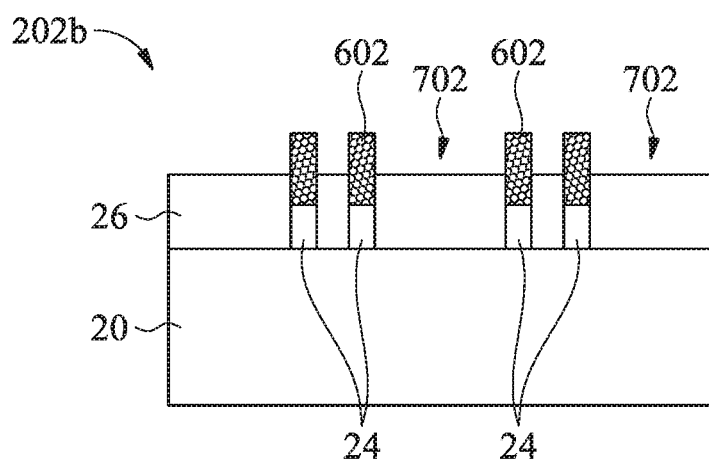
Figure 8C:
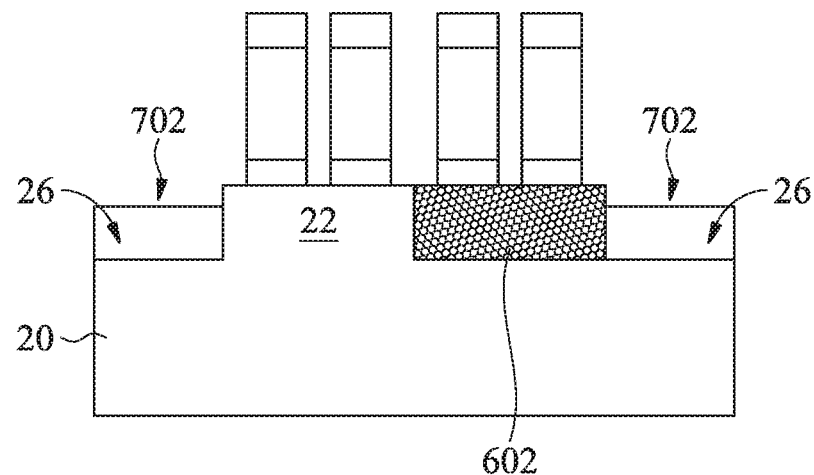
Figure 8D:
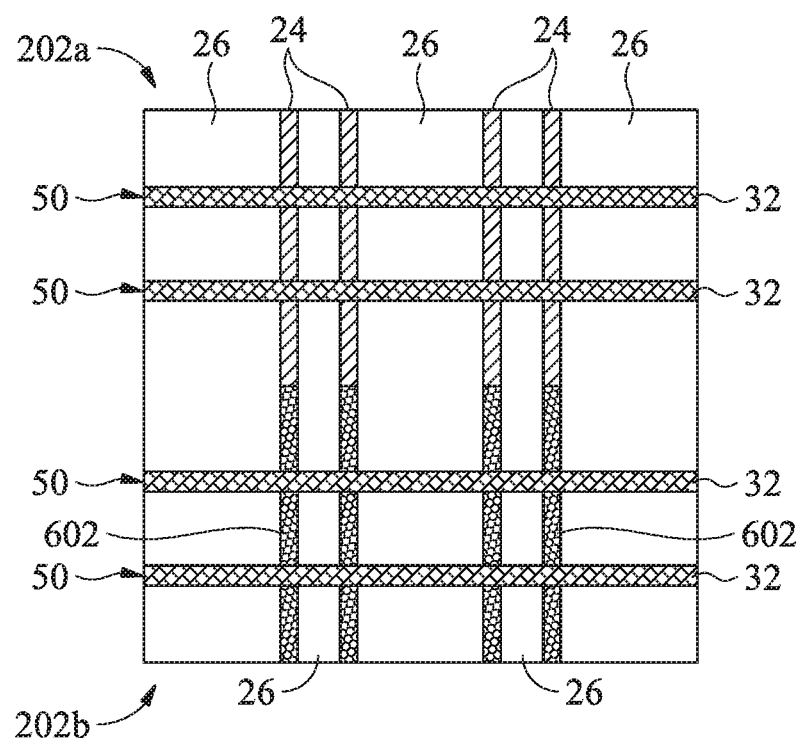

At operation 110, a dummy gate structure 50 is formed on the substrate, as depicted in FIGS. 8A-8D. The dummy gate structure 50 is over and extends laterally perpendicularly to the fin structures 24 and the heteroepitaxial fin structures 602. Each dummy gate structure 50 comprises a gate dielectric layer 28, a gate electrode layer 30, and a hard mask 32, as shown in FIG. 8C. In a replacement gate process, the gate dielectric layer 28 may be an interfacial dielectric. The gate dielectric layer 28, the gate electrode layer 30 and the hard mask 32 for the dummy gate structure 50 may be formed by sequentially forming respective layers, and then patterning those layers into the dummy gate structure 50. For example, a layer for the interfacial dielectrics may include or be silicon oxide, silicon nitride, the like, or multilayers thereof, and may be thermally and/or chemically grown on the fin structure 24 and the heteroepitaxial fin structures 602, or conformally deposited, such as by PECVD, ALD, PEALD or another deposition technique. A layer for the gate electrode layer 30 may include or be silicon (e.g., polysilicon) or another material deposited by CVD, PVD, or another deposition technique. A layer for the hard mask 32 may include or be silicon nitride, silicon oxynitride, silicon carbon nitride, the like, or a combination thereof, deposited by CVD, PVD, ALD, or another deposition technique. The layers for the hard mask 32, gate electrode layer 30, and the gate dielectric layer 28 may then be patterned, for example, using photolithography and one or more etch processes, like described above, to form the hard mask 32, gate electrode layer 30, and gate dielectric layer 28 for each dummy gate structure 50.

In some embodiments, after forming the dummy gate structure 50, lightly doped drain (LDD) regions (not specifically illustrated) may be formed in the active areas. For example, dopants may be implanted into the active areas (e.g., fin structures 24 or heteroepitaxial fin structures 602) using the dummy gate structures 50 as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 9A:
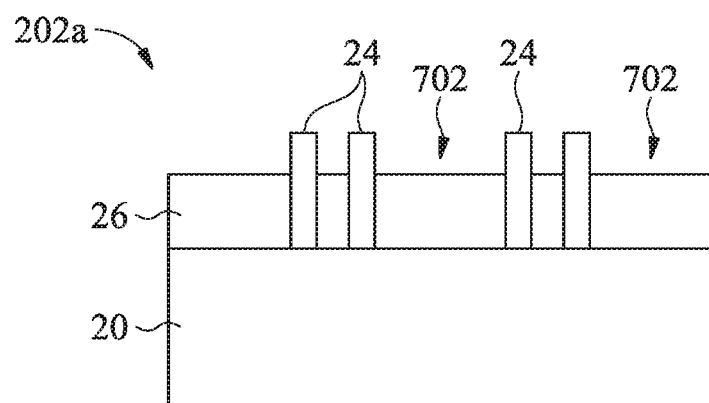
Figure 9B:
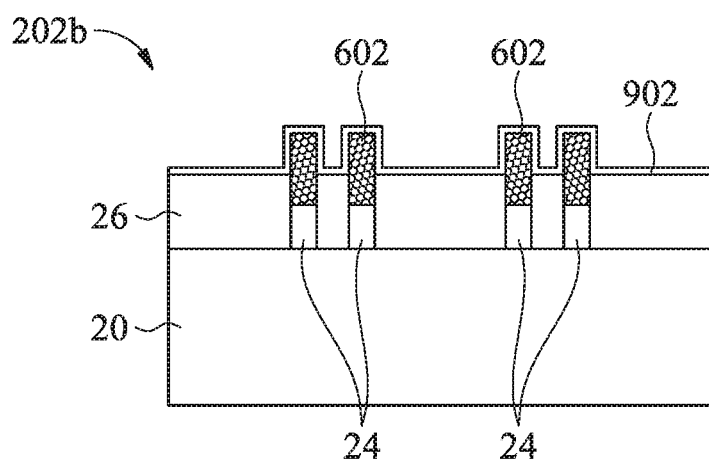
Figure 9C:
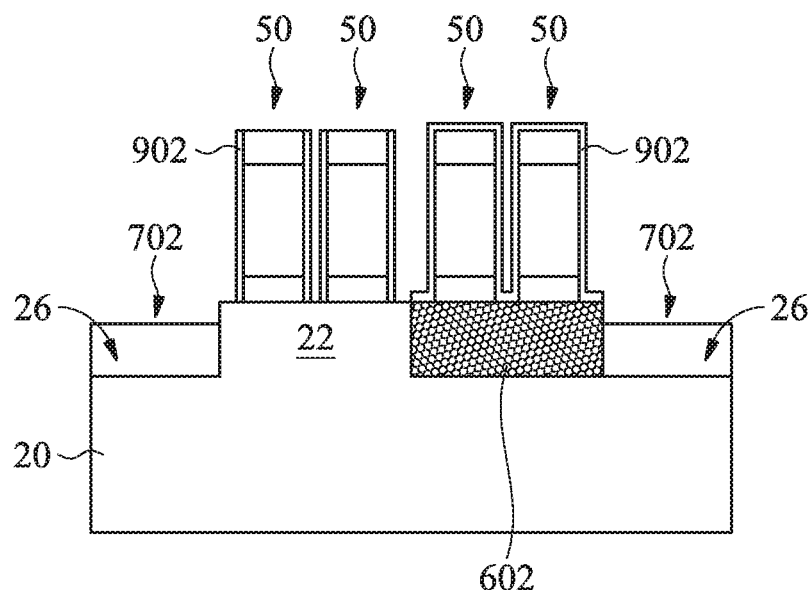
Figure 9D:
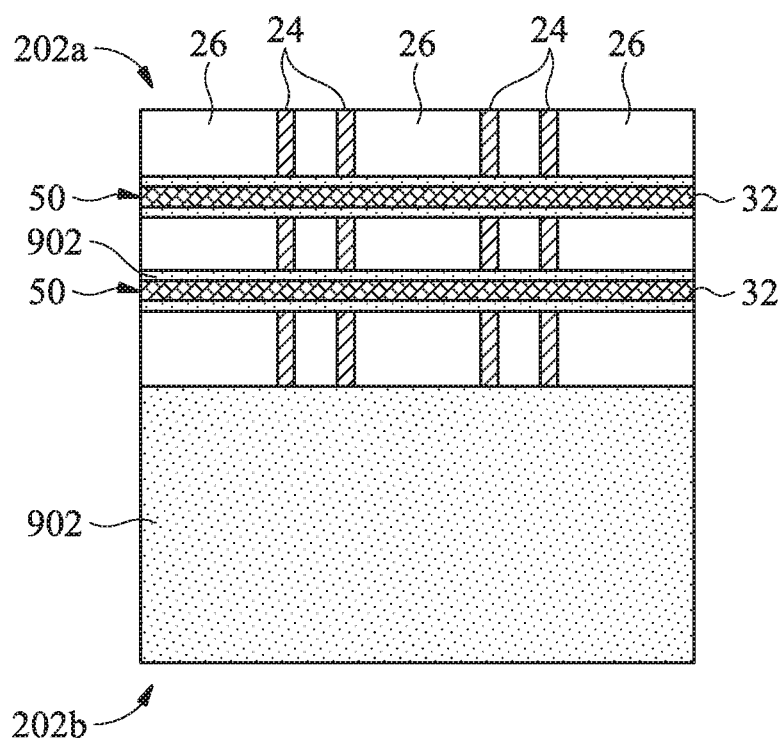

At operation 112, a first mask layer 902 is formed on a first region, such as the p-type region 202b, of the substrate 20, as shown in FIGS. 9A-9D. The first mask layer 902 serves as a mask layer that may protect the heteroepitaxial fin structures 602 from deposition or etching in the subsequent processes. It is noted that the first mask layer 902 may be first formed as a blanket layer on the substrate 20 and later patterned and etched to selectively form on the p-type region 202b of the substrate with a desired profile. The first mask layer 902 may also be formed to be a spacer feature formed on sidewalls of the dummy gate structures 50 in the n-type region 202a, as shown in FIG. 9C. The first mask layer 902 is formed conformally on the substrate 20. In one example, the first mask layer 902 is formed from a dielectric material. For example, the first mask layer 902 may be fabricated from a material comprising silicon nitride (SiN), silicon oxynitride (SiON), silicon oxide (SiO$_2$), silicon oxycarbide (SiOC), amorphous carbon, carbon containing materials, or the like. In one specific example, the first mask layer 902 is fabricated from a silicon nitride material.

In one example, the first mask layer 902 may be formed by any suitable deposition process. In one specific example, the first mask layer 902 may be formed by an atomic layer deposition (ALD) process or a chemical vapor deposition (CVD) process. A photoresist may then be formed over the first mask layer 902 in the p-type region 202b, and an anisotropic etch process may be performed on the first mask layer 902 in the n-type region 202a to form the spacer features and expose portions of the fin structures 24 in the n-type region 202a while maintaining the first mask layer 902 in the p-type region 202b. The photoresist may then be removed in an ashing or wet strip processes, for example.

Figure 10A:
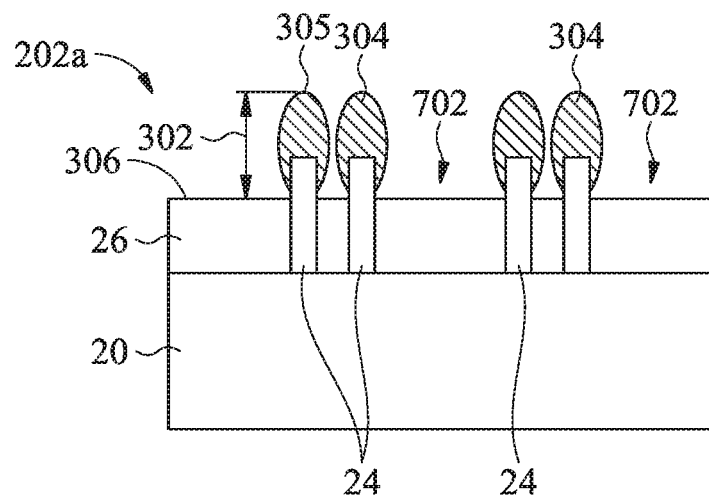
Figure 10B:
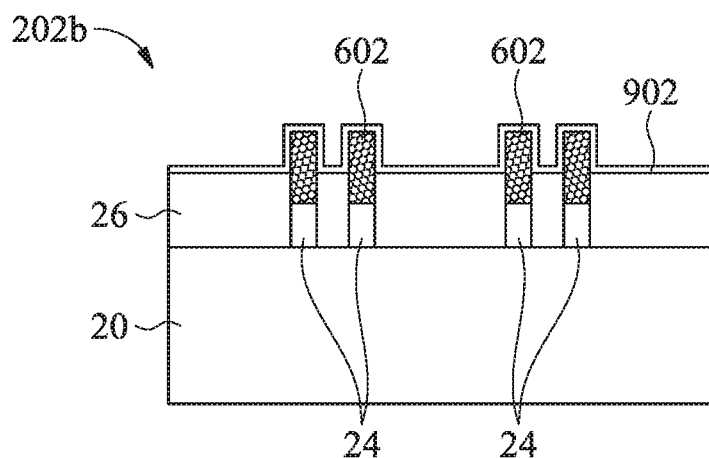
Figure 10C:
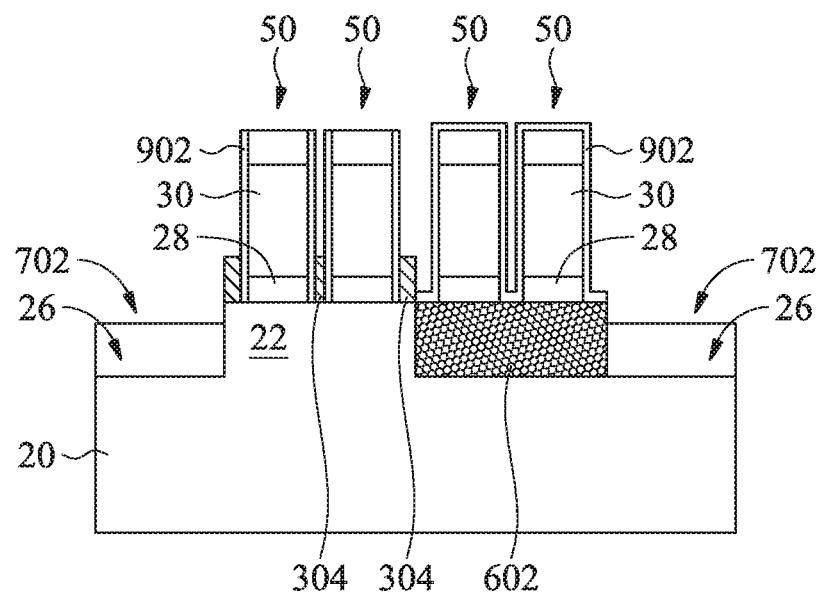
Figure 10D:
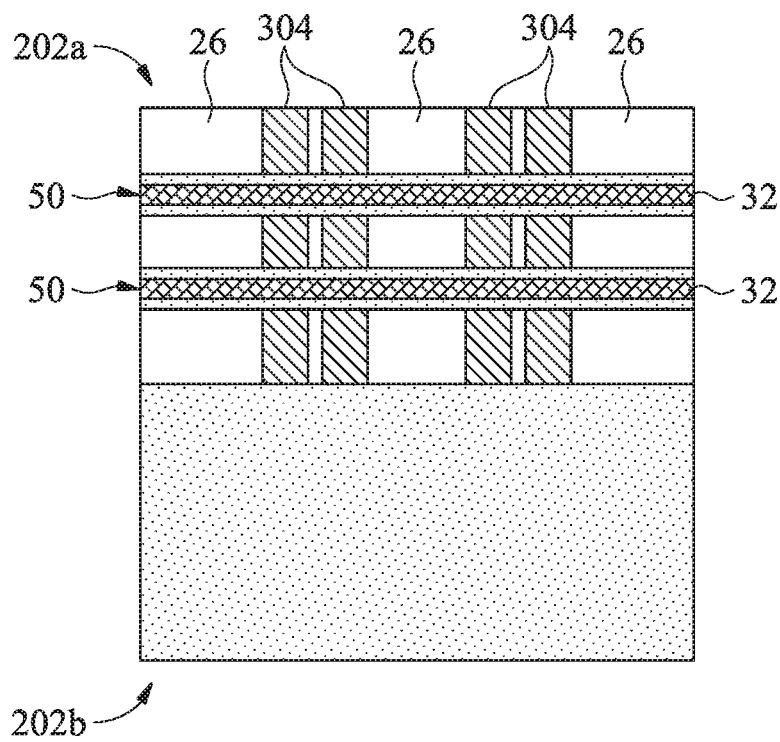

At operation 114, an epitaxial deposition process is performed to grow an n-type epi-material 304 onto the fin structure 24 in the n-type region 202a, as shown in FIGS. 10A-10D. The n-type epi-material 304 may be later utilized to form and serve as source/drain or source/drain extension regions in the n-type region 202a. The epitaxial growth of the n-type epi-material 304 naturally grows onto silicon materials of the fin structure 24 and a portion of the substrate 20, as shown in FIGS. 10A and 10C. The heteroepitaxial fin structures 602 in the p-type region 202b is free from the deposition of the n-type epi-material 304 due to the protection of the first mask layer 902, as shown in FIG. 10B. The structure or shape of the n-type epi-material 304 formed on the fin structure 24 may be controlled by the crystallographic orientation of the silicon material in certain planes, as shown in FIG. 10A. Thus, different growth rates are often found at different surfaces of fin structure 24, such as different growth rates found from a horizontal surface or from a vertical surface. In the example depicted in FIG. 10A, the n-type epi-material 304 is formed atop of the fin structure 24 having a vertical growth rate relatively greater than a horizontal growth rate, forming an oval like structure around and above the fin structure 24, as shown in FIG. 10A. It is noted that the structure and the shape of the n-type epi-material 304 may be in any form as needed. It is noted that the oval like structure of the n-type epi-material 304 may be later utilized to form and serve as source/drain and the source/drain extension of a transistor structure.

In some examples, the n-type epi-material 304 formed on each fin structure 24 may or may not be merged. Although the example depicted in FIG. 10A shows that the n-type epi-material 304 formed on the fin structure 24 are not merged, it is noted that the n-type epi-material 304 may be merged with certain side of the n-type epi-material 304 on one of the fin structures 24 overlapped with the n-type epi-material 304 on another one of the fin structures 24 due to the constrained spacing between the fin structures 24.

In one example, the n-type epi-material 304 may include n-type doped silicon material formed on the fin structures 24 in the n-type region 202a. Suitable example n-type dopants that may be utilized for the n-type epi-material 304 include phosphorus (P), arsenic (As), antimony (Sb), or the like. The n-type epi-material 304 is formed by molecular beam epitaxy (MBE), liquid phase epitaxy (LPE), vapor phase epitaxy (VPE), selective epitaxial growth (SEG), the like, or a combination thereof. The n-type epi-material 304 may be in situ doping during epitaxial growth and/or by implanting dopants into the epitaxy source/drain regions. The n-type epi-material 304 may have a dopant concentration in a range from about $10^{19}$ cm$^{-3}$ to about $5 10^{22}$ cm$^{-3}$. Hence, a source/ drain region may be delineated by doping (e.g., by implantation and/or in situ during epitaxial growth, if appropriate) and/or by epitaxial growth, if appropriate, which may further delineate the active area in which the source/drain region is delineated.

In one specific example, the n-type epi-material 304 is a silicon material or phosphorus (P) doped silicon material ($Si_xP_y$) or the like.

In one embodiment, the n-type epi-material 304 may be formed having a first vertical height 302 from a surface 306 of the isolation structure 26 to a top 305 of the n-type epi-material 304, as shown in FIG. 10A. In one example, the first vertical height 302 of the n-type epi-material 304 is controlled to be in a range from about 20 nm to about 80 nm.

Figure 11A:
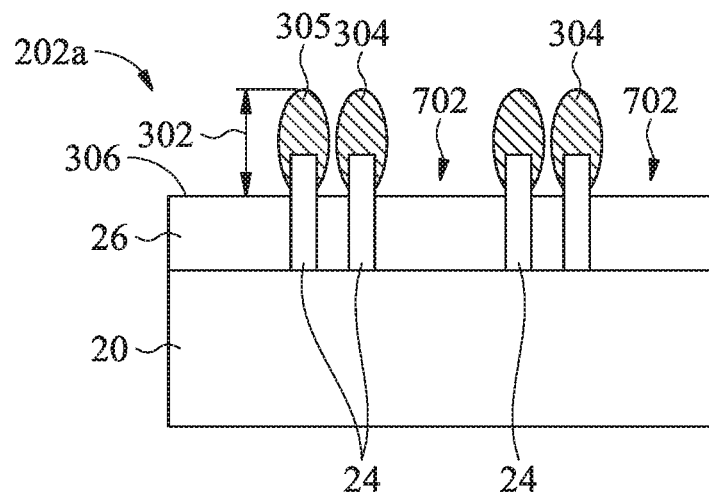
Figure 11B:
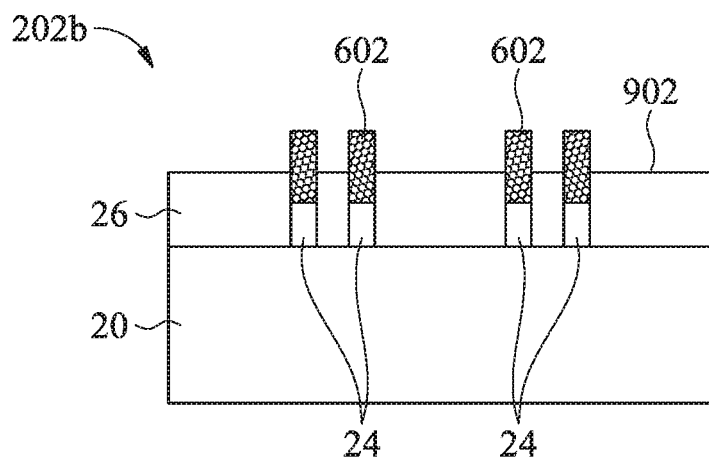
Figure 11C:
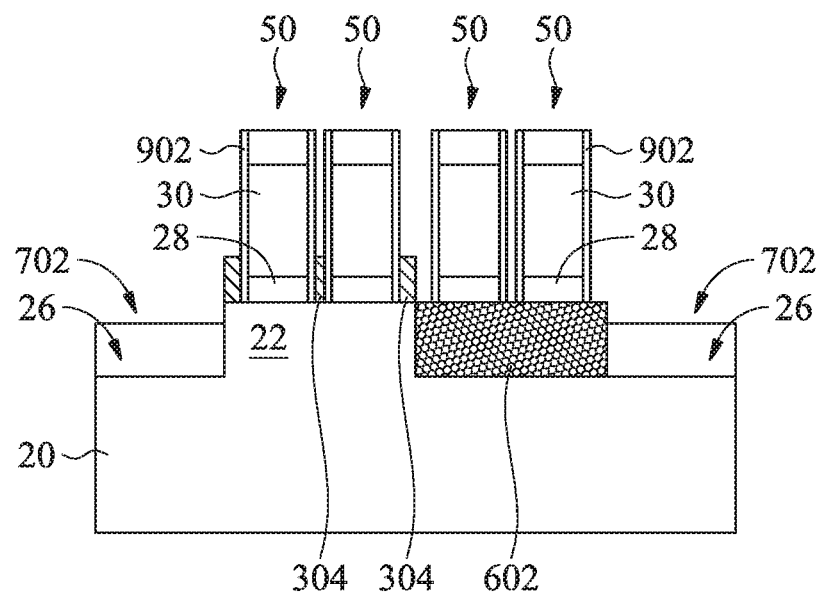
Figure 11D:
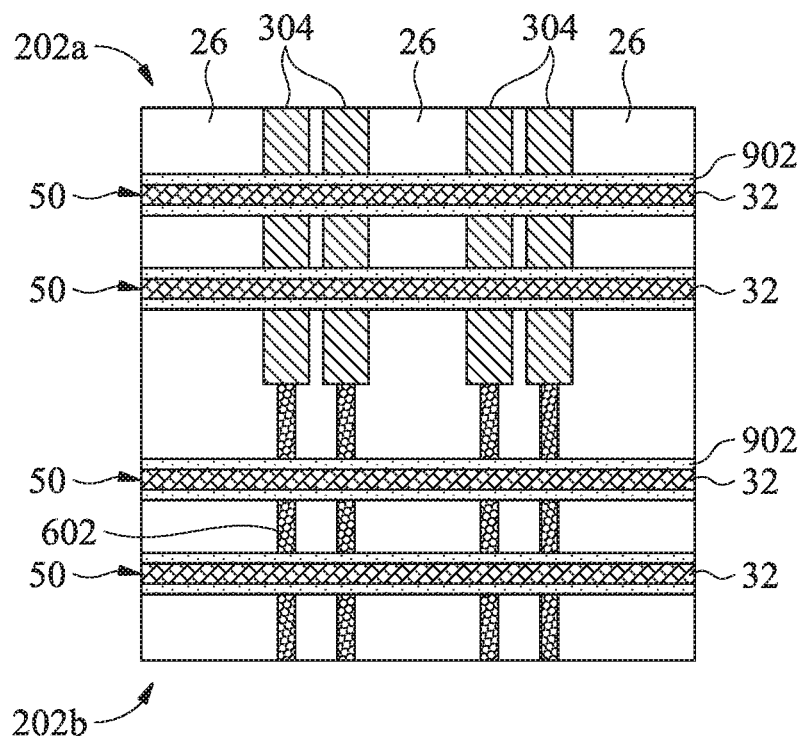

At operation 116, the first mask layer 902 is removed from the substrate 20, as shown in FIGS. 11A-11D, particularly, in the p-type region 202b of the substrate 20. It is noted that a portion of the first mask layer 902 remains on the substrate 20, along the sidewall of the dummy gate structure 50, as shown in FIG. 11C, so as to serve as a spacer feature around the dummy gate structure 50 in both the n-type and p-type regions 202a, 202b. The first mask layer 902 is removed by any suitable etching or patterning process as needed. It is noted that the first mask layer 902 is removed with minimum damage to the n-type epi-material 304 with minimum height/width loss. In one example, the first mask layer 902 may be removed by utilizing an inductively coupled plasma (ICP) anisotropic etching process in a RF source power in a range up to 2000 Watts. The process pressure may be controlled in a range from 10 mTorr to 100 mTorr. The process temperature may be controlled from room temperature to about 140 degrees Celsius. A gas mixture including $CH_3F$ and $O_2$ gas may be utilized to selectively etch away the first hard mask 902 on the top and sidewall of the fin structures 602 with minimum damage to the sidewalls or some portions of the dummy gate structure 50.

Figure 12A:
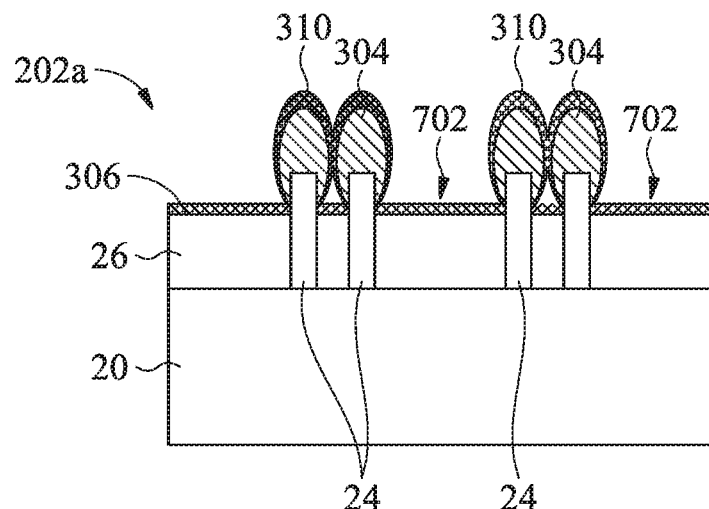
Figure 12B:
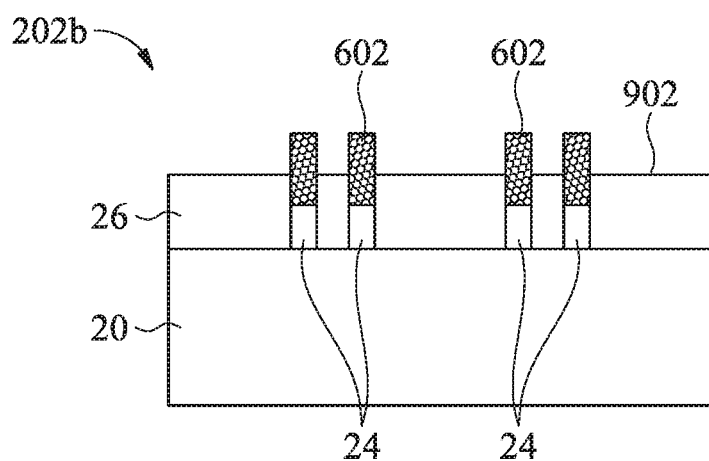
Figure 12C:
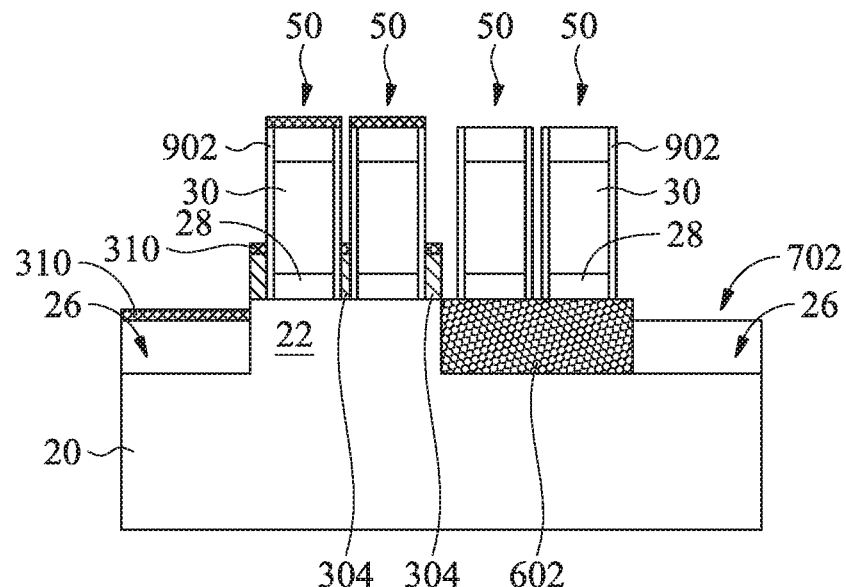
Figure 12D:
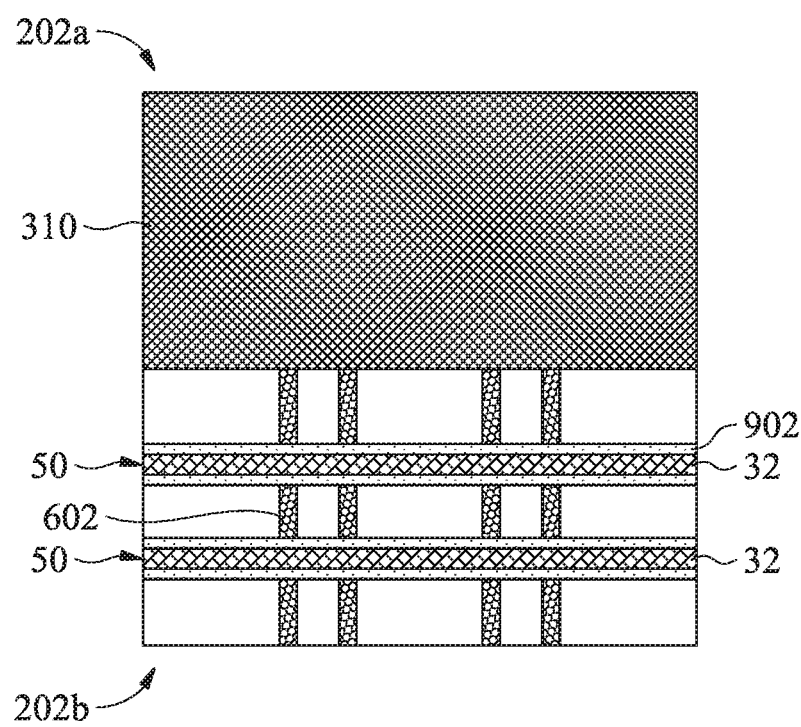

At operation 118, similar to the first mask layer 902, a second mask layer 310 is formed on the n-type region 202a of the substrate 20, as shown in FIGS. 12A-12D. The second mask layer 310 may be fabricated from a material similar to the first mask layer 902. Similarly, the second mask layer 310 may be first formed as a blanket layer on the substrate 20 and later patterned and etched to selectively form on the n-type region 202a of the substrate with a desired profile, as shown in FIGS. 12A and 12C-12D. In one example, the second mask layer 310 is formed from a dielectric material. For example, the second mask layer 310 may be fabricated from a material comprising silicon nitride (SiN), silicon oxynitride (SiON), silicon oxide ($SiO_2$), silicon oxycarbide (SiOC), amorphous carbon, carbon containing materials, or the like. In one specific example, the second mask layer 310 is fabricated from a silicon nitride material. In one example, the second mask layer 310 may be formed by any suitable deposition process. In one specific example, the second mask layer 310 may be formed by an atomic layer deposition (ALD) process or a chemical vapor deposition (CVD) process.

It is noted that the second hard mask 310 as well as the first hard mask 902 may be mostly and/or entirely removed from the substrate, thus leaving no spacer features formed on the substrate at this stage. In this particular embodiment, new spacer features with desired conformality may be later formed after operation 122 but prior to the operation 124. New spacer features may be formed by suitable deposition techniques prior to forming an contact etching stop layer (CESL) 318 and a first interlayer dielectric (ILD) layer 342 at operation 124, which will be described in greater detail below in FIGS. 15A-15D.

Figure 13A:
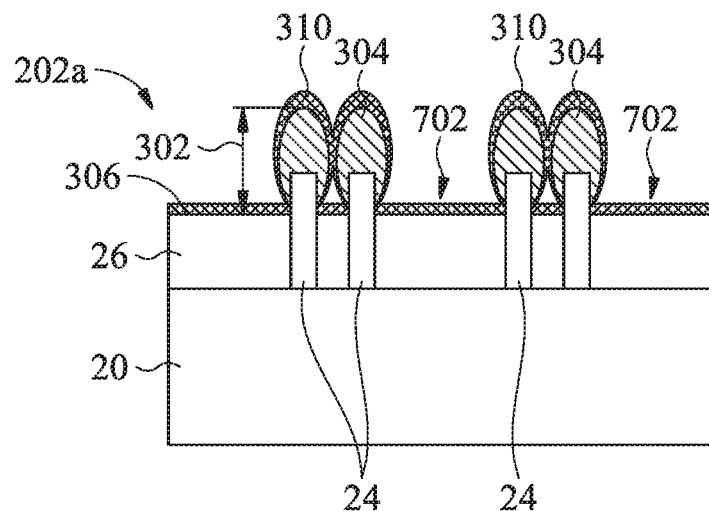
Figure 13B:
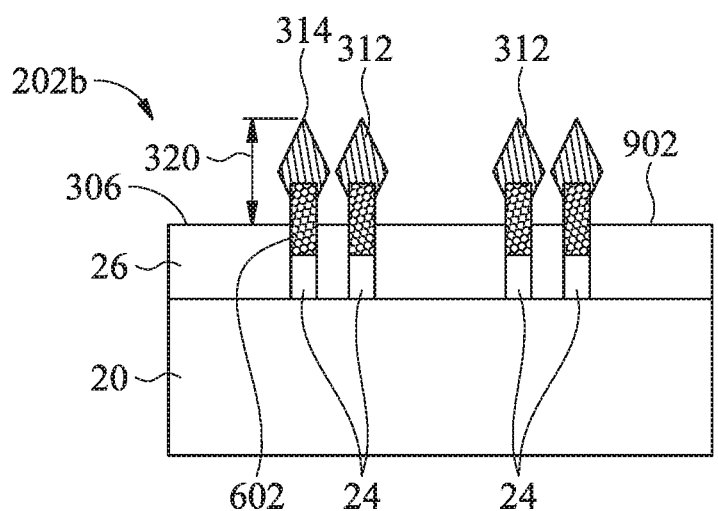
Figure 13C:
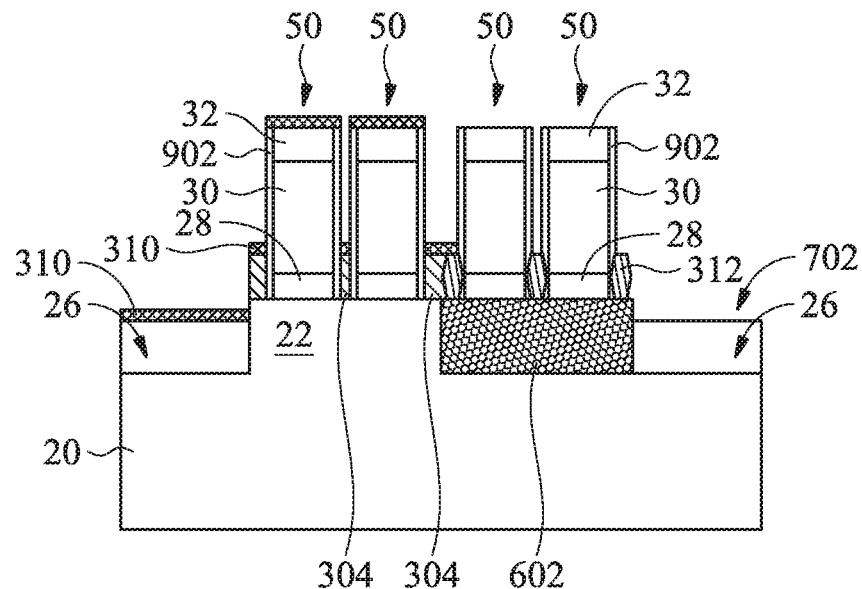
Figure 13D:
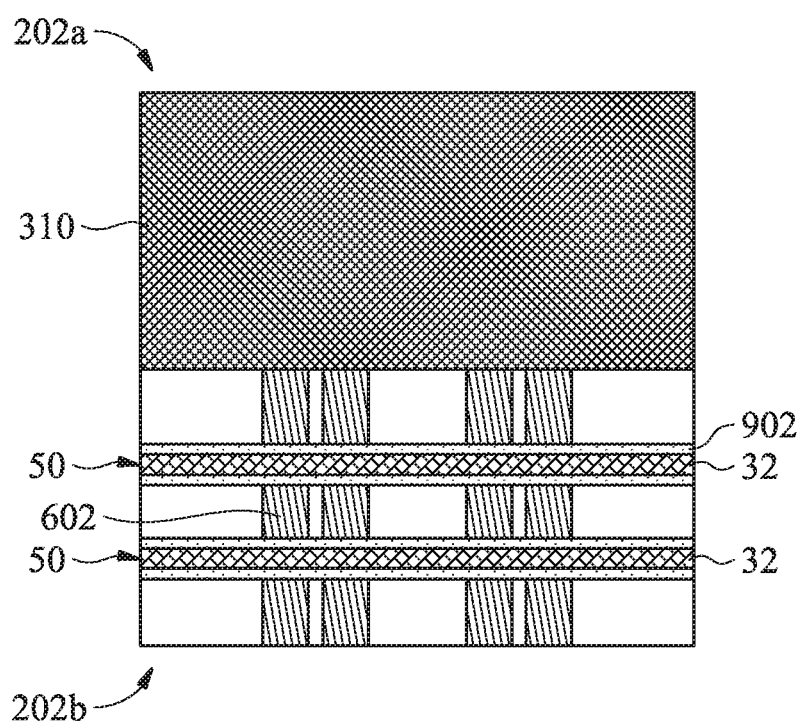

At operation 120, an epitaxial deposition process is performed to grow a p-type epi-material 312 onto the heteroepitaxial fin structures 602, as shown in FIGS. 13A-13D, in the p-type region 202b. The p-type epi-material 312 may be later utilized to form and serve as the source/drain or source/drain extension regions in the p-type region 202b. The epitaxial growth of the p-type epi-material 312 naturally grows onto silicon materials of the heteroepitaxial fin structures 602 and a portion of the substrate 20, as shown in FIGS. 13B and 13C. The n-type epi-material 304 protected by the second mask layer 310 in the n-type region 202a is free from the deposition of the p-type epi-material 312, as shown in FIG. 13A. The epitaxial growth of the silicon naturally grows onto silicon materials, such as the diamond like top structure, atop the heteroepitaxial fin structures 602, as shown in FIG. 13B. The natural shape of the diamond like top structure is controlled by the crystallographic orientation of the silicon material in <111> plane, which normally has the slowest epitaxial growth rate. Thus, during the epitaxial deposition process, the p-type epi-material 312 may grow both vertically and horizontally to form facets, which may correspond to crystalline planes of the heteroepitaxial fin structures 602. Thus, the growth rates of the diamond like top structure of the p-type epi-material 312 are often different on different surfaces of the diamond like top structure of the p-type epi-material 312, such as different growth rates found from a horizontal surface or from a vertical surface. While different growth rates are often occurring at different surfaces with different crystallographic orientations, the resultant shape of the p-type epi-material 312 then has a diamond like top structure, rather than a horizontal planar surface. The diamond like top structure of the p-type epi-material 312 may later be utilized to form source/drain and source/drain extension regions of a transistor structure. Example dopants for the source/drain regions can include or be, for example, boron for a p-type device and phosphorus or arsenic for an n-type device, although other dopants may be used. It is noted that the structure and the shape of the p-type epi-material 312 may be in any form as needed. It is noted that the diamond like structure of the p-type epi-material 312 may be later utilized to form source/drain and the source/drain extension of a transistor structure.

Figure 14A:
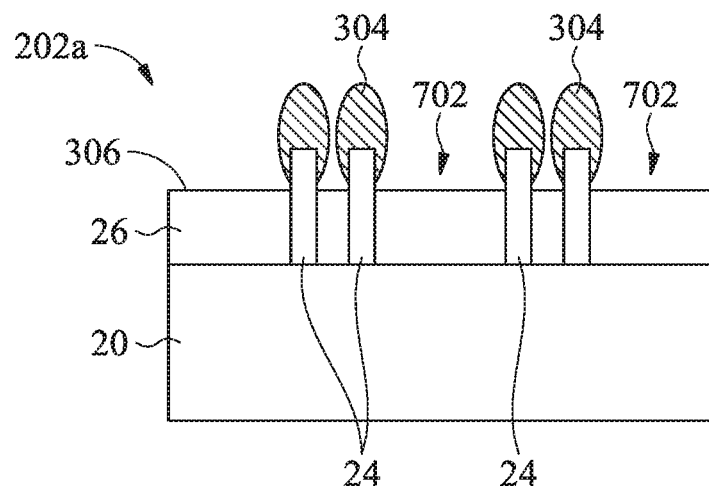
Figure 14B:
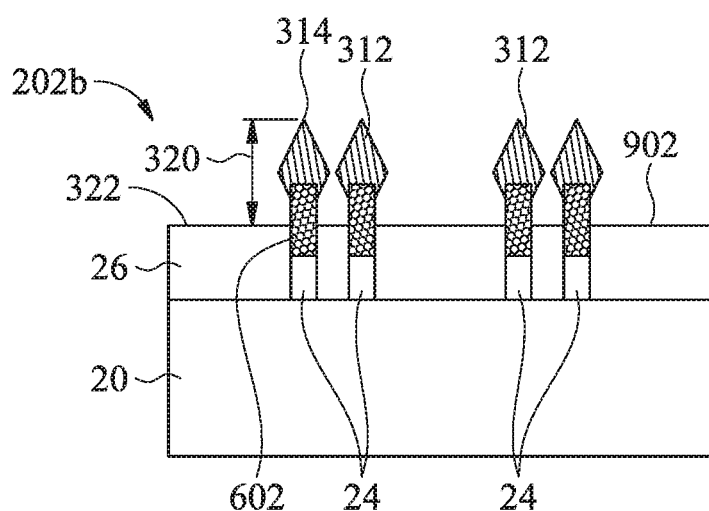
Figure 14C:
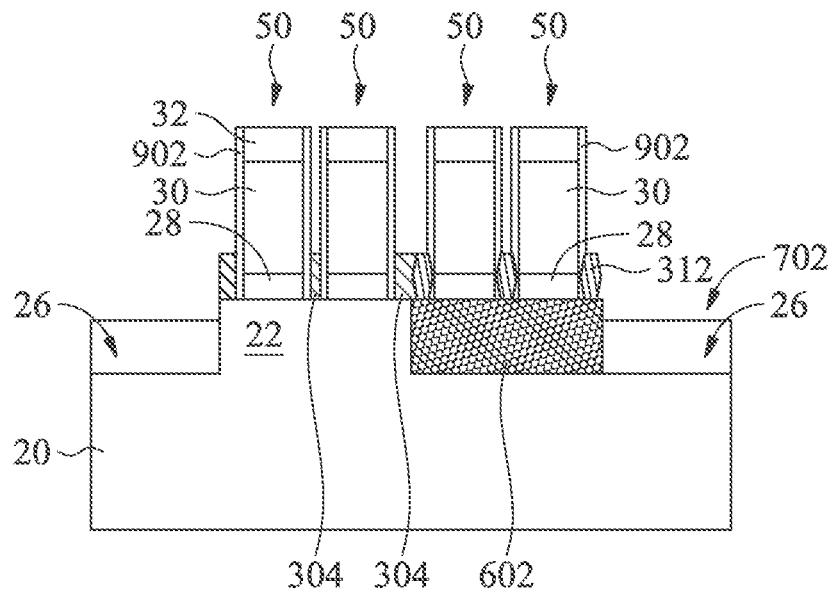
Figure 14D:
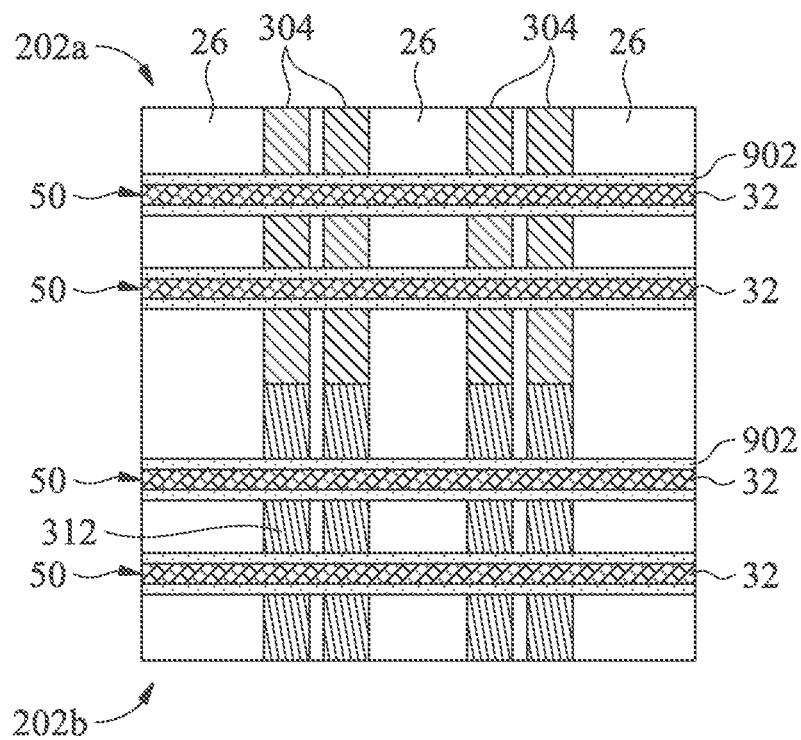

In some examples, the p-type epi-material 312 formed on each heteroepitaxial fin structures 602 may or may not be merged. Although the example depicted in FIG. 14B shows that the p-type epi-material 312 formed on the heteroepitaxial fin structures 602 are not merged, it is noted that the p-type epi-material 312 may be merged with certain side of the p-type epi-material 312 on one of the heteroepitaxial fin structures 602 overlapped with the p-type epi-material 312 on another one of the heteroepitaxial fin structures 602 due to the constraint spacing between the heteroepitaxial fin structures 602.

In one example, the p-type epi-material 312 may include p-type doped silicon material formed on the heteroepitaxial fin structures 602 in the p-type region 202b. Suitable example p-type dopants or suitable dopants that may be utilized for p-type epi-material 312 include boron (B), gallium (Ga), aluminum (Al), germanium (Ge) or the like. The p-type epi-material 312 is formed by molecular beam epitaxy (MBE), liquid phase epitaxy (LPE), vapor phase epitaxy (VPE), selective epitaxial growth (SEG), the like, or a combination thereof. The p-type epi-material 312 may be in situ doping during epitaxial growth and/or by implanting dopants into the epitaxy source/drain regions. The p-type epi-material 312 may have a dopant concentration in a range from about $10^{19}$ cm$^{-3}$ to about $5 \times 10^{22}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

In one specific example, the p-type epi-material 312 is a silicon germanium (SiGe) or boron (B) doped silicon material ($Si_xB_y$) or the like.

In one embodiment, the p-type epi-material 312 may be formed having a second vertical height 320 from the surface 306 of the isolation structure 26 to a top 314 of the p-type epi-material 312, as shown in FIG. 13B. In one example, the second height 320 of the p-type epi-material 312 is in a range from about 20 nm to about 80 nm.

It is noted that the first vertical height 302 and the second vertical height 320 of the n-type epi-material 304 and the p-type epi-material 312 may be individually controlled to be formed at different ranges for different electrical performance requirements. For example, the first vertical height 302 of the n-type epi-material 304 may be configured to be greater (e.g., higher) than the second vertical height 320 of the p-type epi-material 312. It is believed that the greater height of the first vertical height 302 of the n-type epi-material 304 in the n-type region 202a may provide a semiconductor device with higher electron mobility, device speed and lower $R_c$ (e.g., lower contact resistance), as the electrical performance of the n-type region 202a is controlled by electrons (e.g., typically have greater conductivity), rather than the holes in the p-type region 202b. Thus, by forming the n-type epi-material 304 having the first vertical height 302 greater than the second vertical height 320 of the p-type epi-material 312, the electrical device performance of the semiconductor devices may be adjusted and altered as needed. In one example, the greater height of the first vertical height 302 of the n-type epi-material 304 may be obtained by adjusting deposition time during the epitaxial deposition process at operation 114 and 120.

In one example, the first vertical height 302 of the n-type epi-material 304 is controlled to be in a range from about 8% to about 20%, such as about 10%, greater than the second vertical height 320 of the p-type epi-material 312.

Furthermore, the greater height (e.g., dimension) of the n-type epi-material 304 is also believed to provide a greater contact surface area (e.g., greater conductive surface area) when later in contact with a conductive feature in a contact trench fabrication process. Details regarding the conductive feature in the contact trench fabrication process will be described later below with reference to FIGS. 18A-18D and 19A-19D.

At operation 122, similar to the removal of the first mask layer 902, the second mask layer 310 is removed from the substrate 20, as shown in FIGS. 14A-14D, particularly, in the n-type region 202a of the substrate 20. The second mask layer 310 is removed by any suitable etching or patterning process as needed. It is noted that the second mask layer 310 is removed with minimum damage to the p-type epi-material 312 and n-type epi-material 304 with minimum height/width loss.

At operation 124, a contact etching stop layer (CESL) 318 and a first interlayer dielectric (ILD) layer 342 are sequentially formed on the substrate 20, as shown in FIGS. 15A-15D, covering the dummy gate structure 50, as well as the p-type epi-material 312 and n-type epi-material 304. The CESL 318 can provide a mechanism to stop an etch process when forming, e.g., contacts or vias. The contact etch stop layer (CESL) 318 may be formed of a dielectric material having a different etch selectivity from adjacent layers or components. The CESL 318 is conformally formed on surfaces of the p-type epi-material 312 and n-type epi-material 304, sidewalls and top surfaces of the first mask layer 902 (e.g., the spacer feature), top surfaces of the hard mask 32 of the dummy gate structure 50, and top surfaces of the isolation structures 26. The CESL 318 may comprise or may be a nitrogen containing material, a silicon containing material, and/or a carbon containing material and may be deposited by CVD, PECVD, ALD, or another deposition technique. Furthermore the CESL 318 may comprise or may be silicon nitride, silicon carbon nitride, carbon nitride, silicon oxynitride, silicon carbon oxide, the like, or a combination thereof. The CESL 318 may be deposited by a deposition process, such as a Plasma Enhanced ALD (PEALD), CVD, or another deposition technique.

Figure 15A:
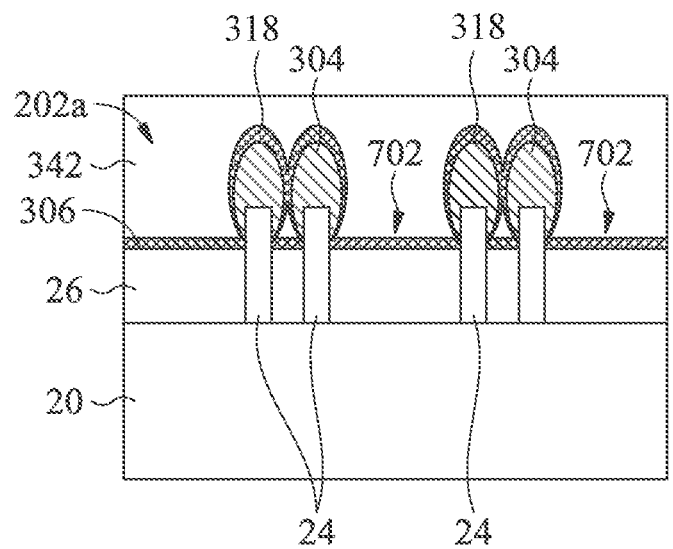
Figure 15B:
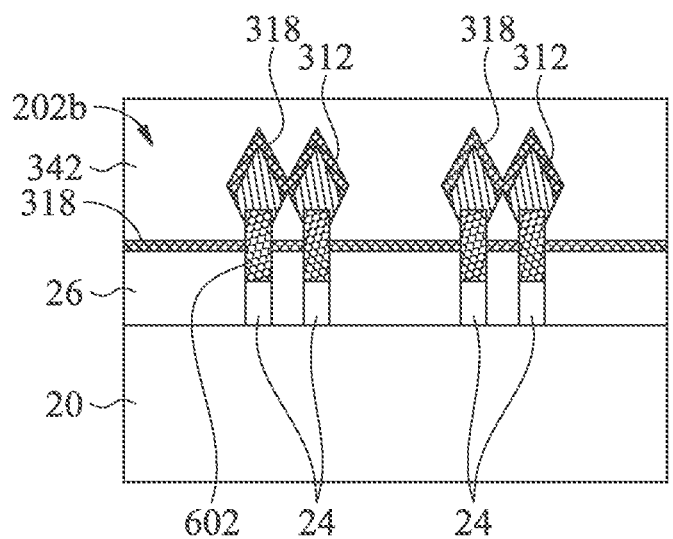
Figure 15C:
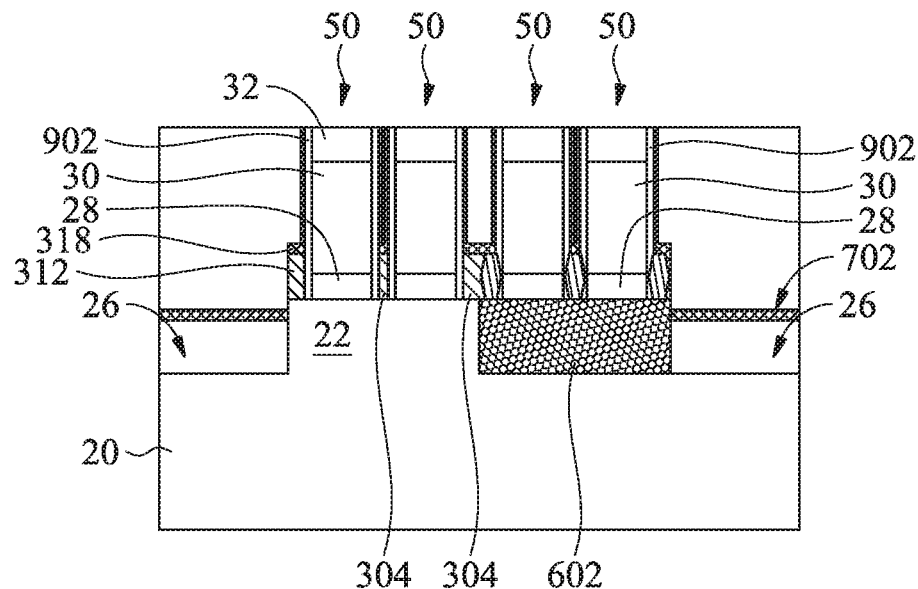
Figure 15D:
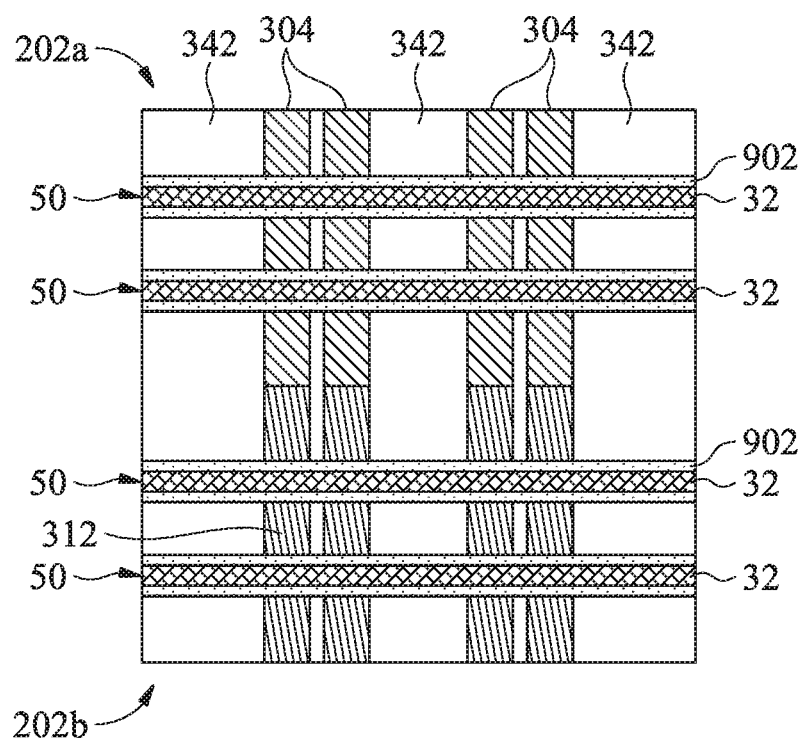

The first ILD layer 342 is formed over the CESL 318, as shown in FIGS. 15A-15C. The first ILD layer 342 may include materials such as tetraethylorthosilicate (TEOS) oxide, un-doped silicate glass, silicon dioxide, a low-k dielectric material (e.g., a material having a dielectric constant lower than silicon dioxide), doped silicon oxide such as borophosphosilicate glass (BPSG), fused silica glass (FSG), phosphosilicate glass (PSG), boron doped silicon glass (BSG), $SiO_xC_y$, Spin-On-Glass, Spin-On-Polymers, silicon carbon material, a compound thereof, a composite thereof, and/or other suitable dielectric materials. The first ILD layer 342 may be deposited by a spin-on, CVD, FCVD, PECVD, PVD, or other suitable deposition technique. In an embodiment, the first ILD layer 342 is formed by a flowable CVD (FCVD) process to fill between neighboring dummy gate structures 50. It is noted that after the thermal annealing process, the first ILD layer 342 may be planarized, such as by a CMP, to provide a planar surface as needed.

Figure 16A:
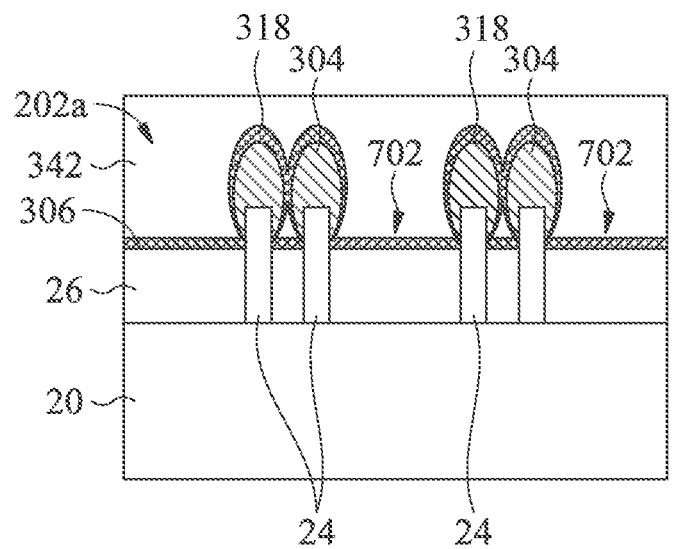
Figure 16B:
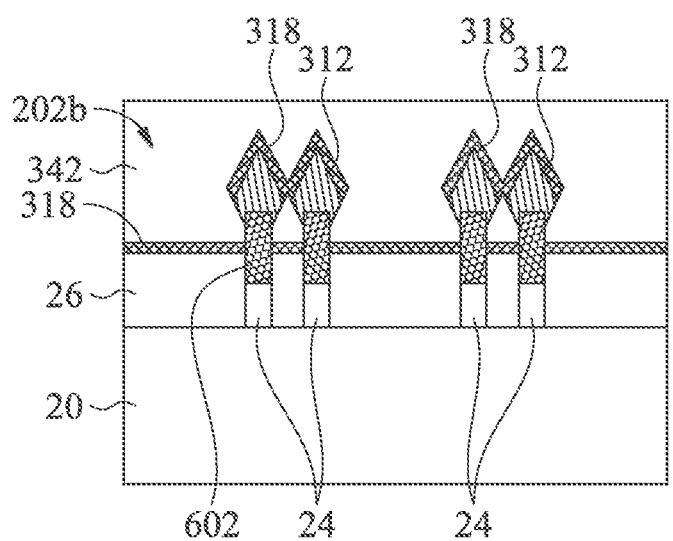
Figure 16C:
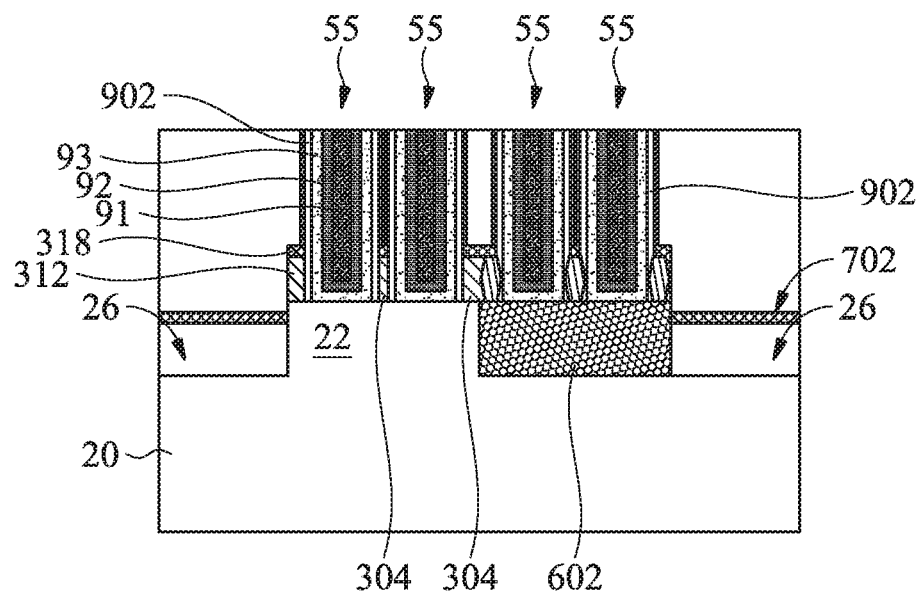
Figure 16D:
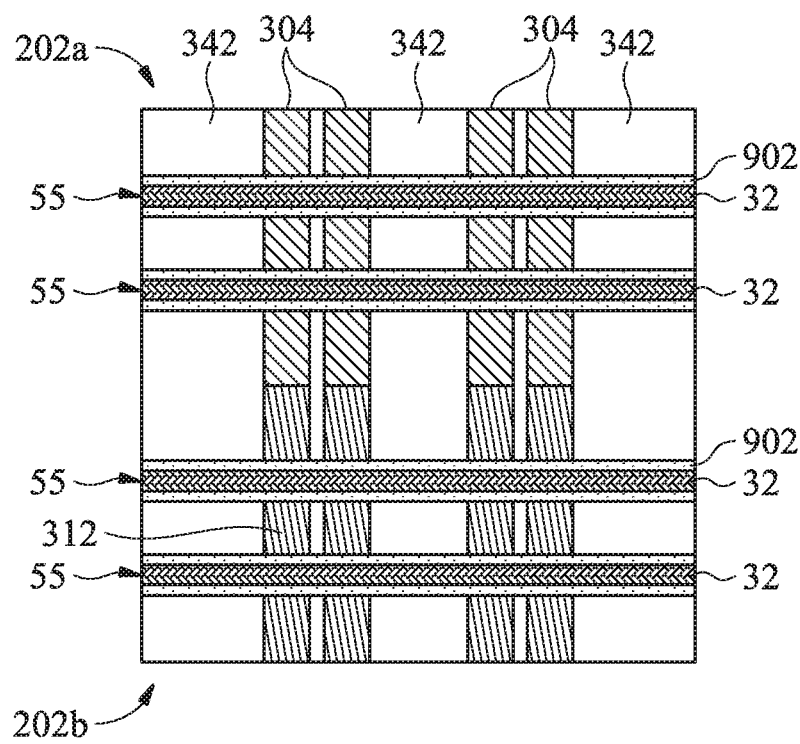
Figure 17A:
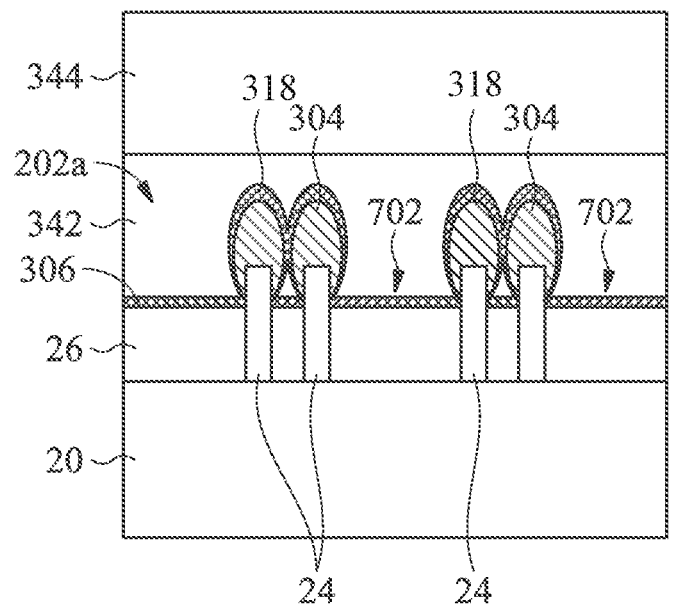
Figure 17B:
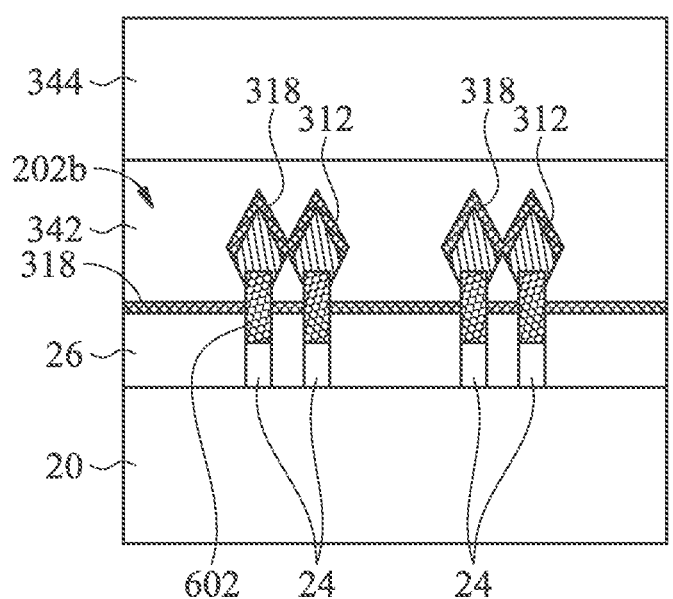
Figure 17C:
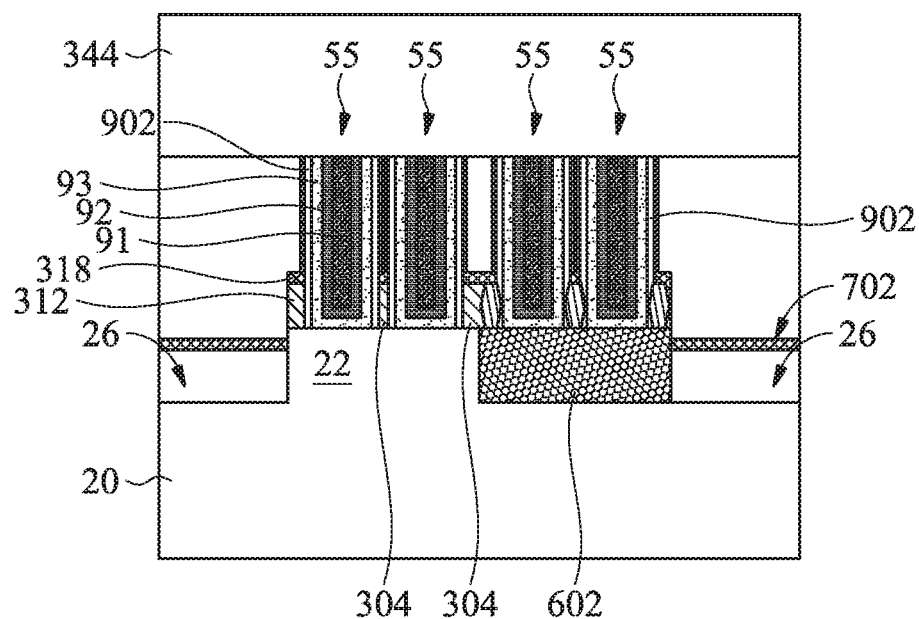
Figure 17D:
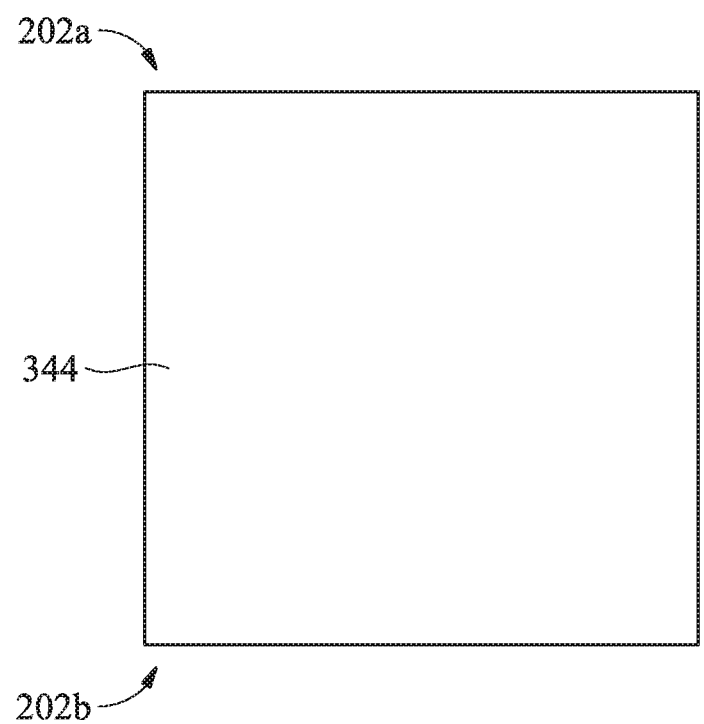

At operation 126, subsequently, the dummy gate structure 50 is removed from the substrate 20 to allow a replacement gate structure 55, such as a metal gate structure, to be formed therein to continue manufacturing the semiconductor device structure 201, as shown in FIGS. 16A-16D. While removing the dummy gate structure 50 from the substrate 20, a series of plasma etching, wet etching, or patterning process is performed. After the dummy gate structure 50 is removed, the replacement gate structure 55 may then be filled and formed in the place where the dummy gate structure 50 is removed and replaced. The replacement gate structure 55 may be a metal gate structure including an interfacial layer (not shown), a high dielectric constant dielectric layer 93, a work function tuning layer 92 and a metal electrode structure 91 formed therein to form the metal gate structure 55, as shown in FIG. 16C specifically.

At operation 128, a second interlayer dielectric (ILD) layer 344 is formed on the first ILD layer 342 covering the replacement gate structure 55, as depicted in FIGS. 17A-17D. The second ILD layer 344 may comprise materials similar to the first ILD layer 342 fabricated by a suitable deposition technique similarly described above when forming the first ILD layer 342.

At operation 130, a contact trench 57 is formed through the second ILD layer 344, the first ILD layer 342 and the CESL 318 to expose at least portions of a portion of the p-type epi-material 312 (shown as 312a, 312b, 312c, 312d in FIG. 18B) and n-type epi-material 304 (shown as 304a, 304b, 304c, 304d in FIG. 18A) (e.g., the epitaxy source/drain regions), as shown in FIG. 18A-18D. The contact trench 57 will later allow a conductive feature to be formed therein. The second ILD layer 344, the first ILD layer 342, and the CESL 318 may be patterned to form the contact trench 57 therein, for example, using photolithography and one or more etch processes.

Figure 18A:
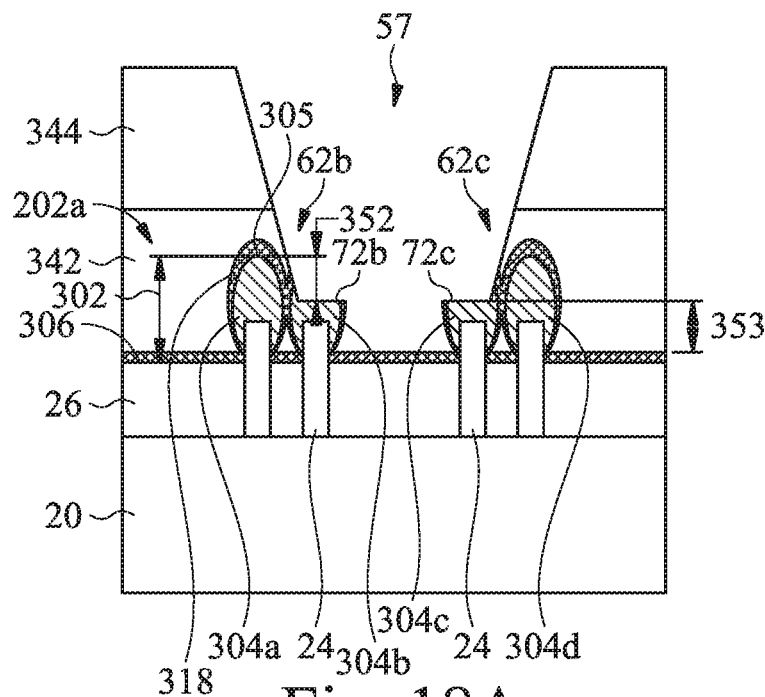
Figure 18B:
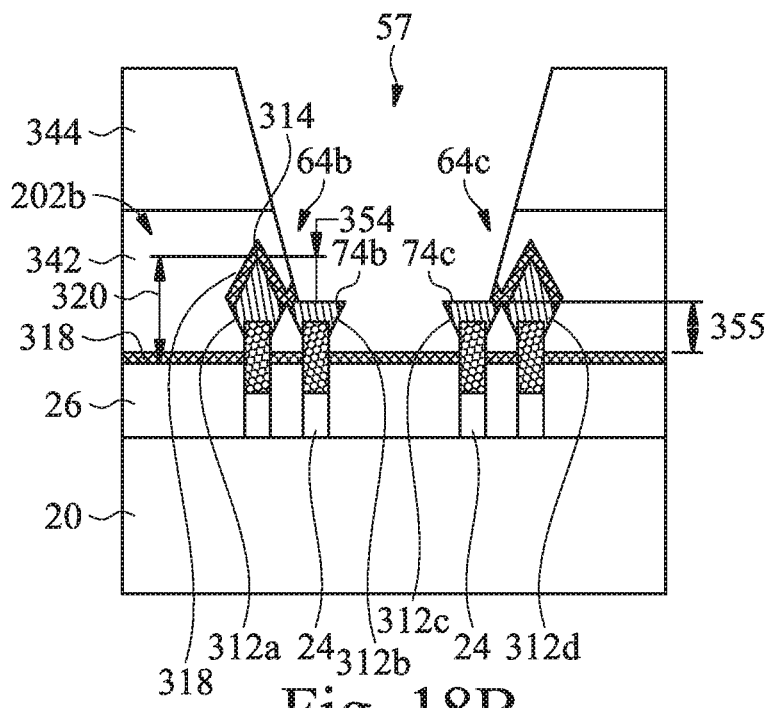
Figure 18C:
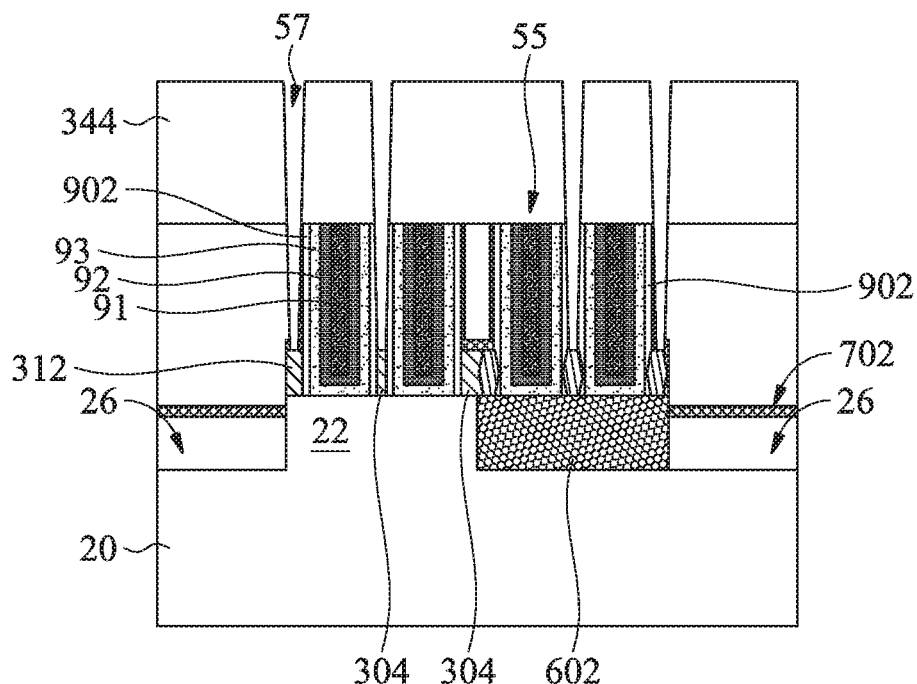
Figure 18D:
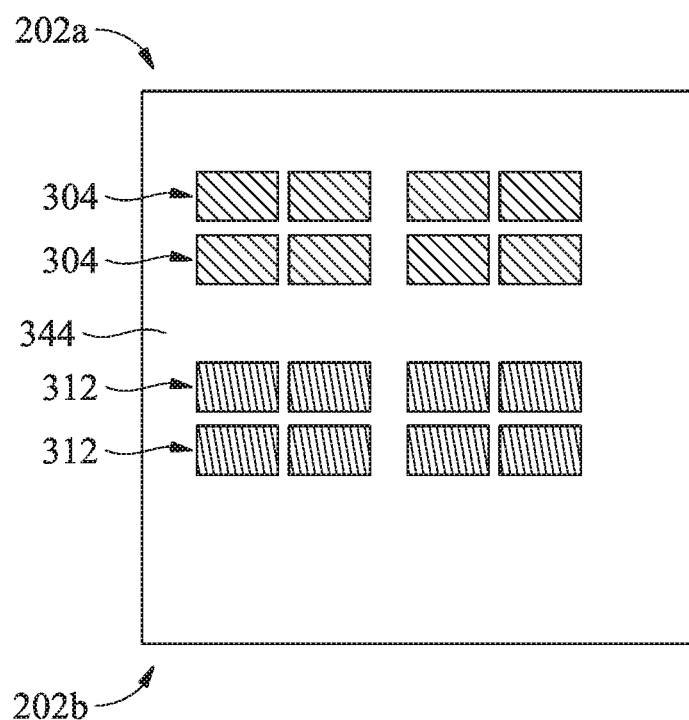
Figure 19A:
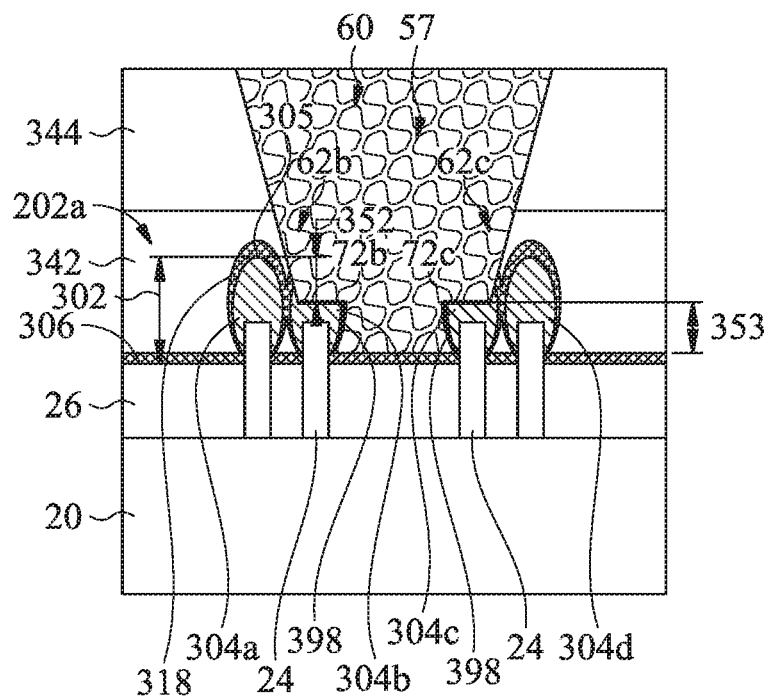
Figure 19B:
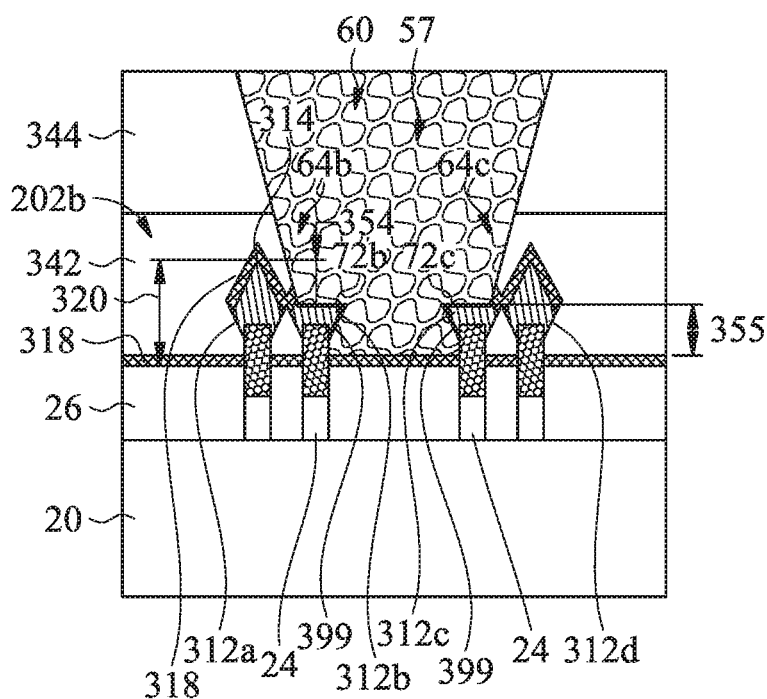
Figure 19C:
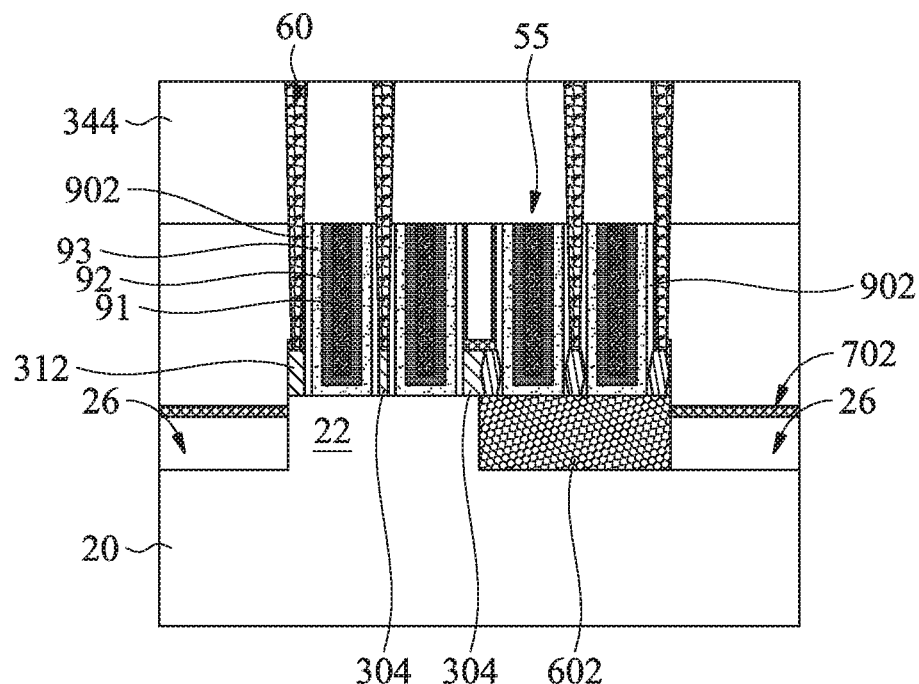
Figure 19D:
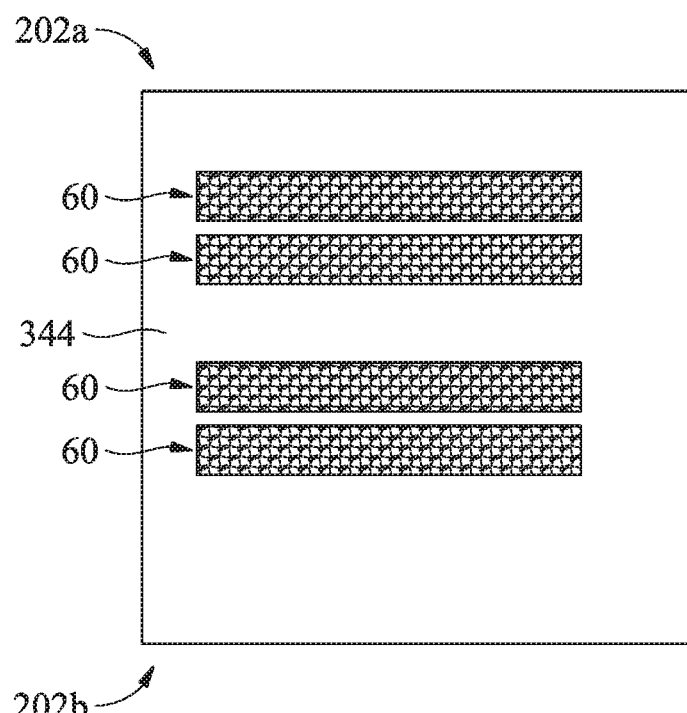

In one example, the contact trench 57 may be formed by an etching process that may efficiently control the selective etching rate to the p-type epi-material 312a, 312b, 312c, 312d over the n-type epi-material 304a, 304b, 304c, 304d. The etching process is controlled to etch a portion of the p-type epi-material 312b, 312c and n-type epi-material 304b, 304c away from the substrate 20, as shown particularly in FIGS. 18A and 18B. In this example, at least a portion of the two neighboring n-type epi-materials 304b, 304c formed on the fin structures 24 at the n-type region 202a is etched away, defining a recess 62b, 62c (e.g., epi-material loss) in the top portion of the neighbor n-type epi-materials 304b, 304c while maintaining the surrounding n-type epi-materials 304a, 304d intact and covered by the CESL 318, the first and the second ILD layers 342, 344, as shown in FIG. 18A. Similarly, at least a portion of the two neighboring p-type epi-materials 312b, 312c formed on the heteroepitaxial fin structures 602 at the p-type region 202b is etched away, defining a recess 64b, 64c in the top portion of the neighbor p-type epi-materials 312b, 312c while maintaining the surrounding p-type epi-materials 312a, 312d intact and covered by the CESL 318, the first and the second ILD layers 342, 344, as shown in FIG. 18B. It is noted that the location of the contact trench 57 is predetermined so as to form the contact trench 57 that exposes the center two neighboring n-type epi-materials 304b, 304c and p-type epi-materials 312b, 312c, which will be later in contact with a conductive feature filled and formed in the contact trench 57.

It is believed that the recesses 62b, 62c, 64b, 64c increase the overall surface area (e.g., from a facet top 314 or a round top 305 to substantially flat top surfaces 72b, 72c, 74b, 74c) in contact with a conductive feature later formed therearound, so that the electrical performance of the semiconductor device may be adjusted and altered as needed. The greater epi-material loss often creates the greater surface area exposed for the source/drain structures to be contact with the conductive feature, thus enhancing the electrical performance of the semiconductor device, such as low contact resistance ($R_c$). Thus, a step height 352, 354 is defined between the top 305, 314 and a top surface 72b, 74b of the n-type and p-type epi-materials 304b, 312b respectively in FIGS. 18A and 18B. The step height 352 defined in the n-type region 202a may be different form the step height 354 defined in the p-type region 202b due to the different etching rates performed on the different materials from the n-type and p-type epi-materials 304b, 312b. In the etching process wherein a greater etching rate is selected to etch the n-type epi-materials 304b in the n-type region 202a over the p-type epi-materials 312b, the amount of the n-type epi-materials 304b being etched away is greater than the amount of the p-type epi-materials 312b, thus resulting in a greater step height 352 than the step height 354 in the p-type region 202b. In contrast, in the etching process wherein a greater etching rate is selected to etch the p-type epi-materials 312b in the p-type region 202b over the n-type epi-materials 304b, the amount of the p-type epi-materials 312b being etched away is greater than the amount of the n-type epi-materials 304b, thus resulting in a greater step height 354 than the step height 352 in the n-type region 202a.

As discussed above, higher flow flux of the electrons in the n-type region 202a (from the n-type dopants) often creates higher electron mobility, current flow and low contact resistance in the semiconductor device, thus enhancing the electrical performance, particularly in NMOS. As a result, a higher step height 352 over the n-type epi-material 304b in the n-type region 202a is desired. In one example, the step height 352 in the n-type region 202a is at least about 5% higher, such as about at least 10% higher, than the step height 354 in the p-type region 202b. In one specific example, the step height 352 in the n-type region 202a is at least about 10%, and more particularly, at least about 20%, higher than the step height 354 in the p-type region 202b. As the step height 352 in the n-type region 202a is higher than the step height 354 in the p-type region 202b, the remaining height 353 (in vertical direction) of the n-type epi-material 304b in the n-type region 202a is less than the remaining height 355 (in vertical direction) of the p-type epi-material 312b in the p-type region 202b.

In one example, the step height 352 in the n-type region 202a is in a range from about 10 nm to about 20 nm and the step height 354 in the p-type region 202b is in a range from about 0.1 nm to about 5 nm.

In one example, the step height 352 (Hn) and the step height 354 (Hp) may have a height ratio (Hn/Hp) greater than 1.1 when the first height 302 (H1) and the second height 320 (H2) have a height ratio (H1/H2) in a range from 0.9-1.1. In another example, the step height 352 (Hn) and the step height 354 (Hp) may have a height ratio (Hn/Hp) in a range from 0.9-1.1 when the first height 302 (H1) and the second height 320 (H2) have a height ratio (H1/H2) greater than 1.1. In yet another example, the step height 352 (Hn) and the step height 354 (Hp) may have a height ratio (Hn/Hp) greater than 1.1 when the first height 302 (H1) and the second height 320 (H2) have a height ratio (H1/H2) greater than 1.1. It is noted that the height ratio between the step heights 352, 354 (Hn, Hp) or between the first and the second height 302, 320 (H1, H2) may be in any ratio combinations as described above.

In one example, step height 352 (Hn) and the step height 354 (Hp) may have a height ratio (Hn/Hp) greater than 1.1. In another example, the step height 352 (Hn) and the step height 354 (Hp) may have a height ratio (Hn/Hp) in a range from 0.9-1.1. In yet another example, the first height 302 (H1) and the second height 320 (H2) have a height ratio (H1/H2) in a range from 0.9-1.1. In still another example, the first height 302 (H1) and the second height 320 (H2) have a height ratio (H1/H2) greater than 1.1. It is noted that the height ratio between the step heights 352, 354 (Hn, Hp) or between the first and the second height 302, 320 (H1, H2) may be in any ratio combinations as described above.

In one embodiment, the etching process utilized to form the contact trench 57 may be a plasma etching process. The plasma etching process may be performed by supplying an etching gas mixture into a plasma processing chamber in which the substrate 20 may be placed. The etching gas mixture may include a carbon fluorine gas, an oxygen containing gas, an inert gas, and a passivation gas. The passivation gas supplied in the etching gas mixture is configured to form a passivation layer over the p-type epi-materials 312b while etching predominately the n-type epi-materials 304b so that the n-type epi-materials 304b may be etched at an etching rate greater than the etching rate for etching the p-type epi-materials 312b. In one example, the passivation gas is a sulfur containing gas. It is believed that the sulfur elements from the passivation gas may react with the germanium elements in the SiGe from the p-type epi-materials 312b, 312c so as to form the passivation layer on the p-type epi-materials 312b, 312c during the patterning process. As a result, the aggressive etchants from the carbon fluorine gas may predominately etch the n-type epi-materials 304b, 304c in the n-type region 202a, resulting in the greater step height 352 in the n-type region 202a, while leaving the p-type epi-materials 312b, 312c in the p-type region 202b protected by the sulfur containing passivation layer. In one example, the passivation gas in the etching gas mixture is carbonyl sulfide (COS) and the like. Suitable examples of the carbon fluorine gas include $CF_4$, $C_2F_2$, $CHF_3$, $CH_3F$, $C_2F_6$, $C_4F_6$, $C_4F_8$ and the like. In one example, the etching gas mixture includes $CF_4$, $O_2$, Ar and COS.

During the etching process, the substrate temperature may be controlled at greater than room temperature, such as greater than 60 degrees Celsius, such as in a range from 60 degrees Celsius to 150 degrees Celsius, for example, particular from 80 degrees Celsius and about 140 degrees Celsius.

As discussed above, it is noted that the electrical performance of the semiconductor device may be adjusted in the operation 130 by utilizing a patterning gas mixture with high selectivity that provides different etch rates to etch the n-type and p-type epi-materials 304, 312 respectively. As a result, the recesses 62b, 62c, 64b, 64c are formed in portions of the n-type and p-type epi-materials 304, 312. The recesses 62b, 62c, 64b, 64c formed on the n-type and p-type epi-materials 304, 312 create greater exposed contact surface area to be in contact with the conductive feature later formed thereon so as to enhance electrical performance of the semiconductor devices. Similarly, as discussed above in operation 114 and 120, different deposition times may be utilized at operations 114 and 120 respectively to grow the n-type and p-type epi-materials 304, 312 with different first and the second vertical heights 302, 320 so that the electrical performance may also be enhanced by grow a greater first vertical height 302 (e.g., greater dimension of the epi-materials that create greater contact surface area) of the n-type epi-material 304 to increase electron mobility, electron current density and reduce contact resistance.

In some examples, the first vertical height 302 and the second vertical height 320 of the n-type and p-type epi-materials 304, 312 may be configured to be substantially similar at operations 114 and 120 while providing a selective etching process at operation 130 to predominately etching the n-type epi-material 304 to provide the recess 62b, 62c with the step height 352 in the n-type region 202a greater than the step height 354 in the p-type region 202b so as to provide a greater surface contact area (e.g., greater loss in the n-type epi-material 304) to the conductive feature later formed thereon.

In other examples, the etching process at operation 130 may be configured to have a substantially similar etching rate over the n-type and p-type epi-materials 304, 312 so that the step heights 352, 354 are substantially similar while the first height 302 of the n-type epi-material 304 formed from operation 114 is configured to be greater than the second height 320 of the p-type epi-material 312 formed from the operation 120 by different deposition time management. Thus, a greater contact surface area in the n-type epi-material 304 may also be obtained due to the greater first vertical height 302 in the n-type epi-material 304 compared to the second vertical height 320 in the p-type epi-materials 312 due to the different dimension/profile of the n-type and p-type epi-material 304, 312.

In yet another example, the electrical performance may be adjusted and enhanced by doing both above, including adjusting the deposition time at operation 112 and 120 to grow first vertical height 302 of the n-type epi-material 304 greater than the second vertical height 320 of the p-type epi-material 312 (e.g., increase of the surface contact area) and also forming the step height 352 in the n-type region 202a greater than the step height 354 in the p-type region 202b (e.g., also increase of the surface contact area).

At operation 132, a first metal silicide layer 398 is then formed on the n-type epi-material 304b, 304c, and a second metal silicide layer 399 is formed on the p-type epi-material 312b, 312c. A conductive feature 60 is then formed on the first and second metal silicide layers 398, 399 filling the contact trench 57, as shown in FIGS. 19A-19D. As discussed above, the greater step height 352 in the n-type region 202a defined from the recess 62b, 62c increases the surface area on which the first metal silicide layer 398 is formed, thus resulting in the first metal silicide layer 398 having a contact surface area (e.g., contact area between the metal silicide layer and the conductive feature) greater than a contact surface area of the second metal silicide layer 399 to the conductive feature 60.

It is noted that after the first and second metal silicide layers 398, 399 are formed, the conductive feature 60 formed in the contact trench 57 may include an adhesion layer (not shown), a barrier layer (not shown) on the adhesion layer, and a conductive material (not shown) on the barrier layer, for example, in total referred as the conductive feature 60 in the contact trench 57. The first and second metal silicide layers 398, 399 may be formed on the exposed surface defined by the recesses 62b, 62c, 64b, 64c defined on the n-type and p-type epi-materials 304b, 304c, 312b, 312c of the epitaxy source/drain regions by reacting upper portions of the n-type and p-type epi-materials 304b, 304b, 312b, 312c with the adhesion layer (not shown) and possibly, the barrier layer (not shown). The conductive material can be deposited on the barrier layer and fill the contact trench 57, forming the conductive feature 60. After the conductive material is deposited, excess conductive material, barrier layer, and adhesion layer may be removed by using a planarization process, such as a CMP, for example. The planarization process may remove excess conductive material, barrier layer, and adhesion layer from above a top surface of the second ILD layer 344. Hence, top surfaces of the conductive feature 60 and the second ILD layer 344 may be substantially coplanar. The conductive feature 60 may be or may be referred to as contacts, plugs, etc.

Although not intended to be limiting, one or more embodiments of the present disclosure provide many benefits to a semiconductor device and the formation thereof. For example, embodiments of the present disclosure can provide methods for forming asymmetric source/drain structures in different regions of the substrate so as to enhance the electrical performance of the semiconductor devices. The asymmetric source/drain structures may be obtained by epi-growing n-type epi-material in the n-type region with different profiles from the p-type epi-material in the p-type region. Furthermore, the asymmetric source/drain structures may also be obtained by utilizing a selective etching process to predominantly etch n-type epi-material in the n-type region to create greater etch n-type epi-material loss (e.g., greater surface area exposed to the conductive feature in the contact trench) so as to enhance the electrical performance. The asymmetric source/drain structures may be obtained by performing either one of the above process or both as needed.

In one embodiment, a semiconductor device includes a first group of source/drain structures on a first group of fin structures on a substrate, a second group of source/drain structures on a second group of fin structures on the substrate, and a first gate structure and a second gate structure over the first and the second group of fin structures, respectively, the first and second groups of source/drain structures being proximate the first and second gate structures, respectively, wherein the first group of source/drain structures on the first group of fin structures has a first source/drain structure having a first vertical height different from a second vertical height of a second source/drain structure of the second group of source/drain structures on the second group of fin structures. In an embodiment, the first group of the source/drain structures further includes a third source/drain structure having a third vertical less than the first vertical height of the first source/drain structure. In an embodiment, the second group of the source/drain structures further includes a fourth source/drain structure having a fourth vertical height less than the second vertical height of the second source/drain structure. In an embodiment, the third vertical height of the third source/drain structure is less than the fourth vertical height of the fourth source/drain structure. In an embodiment, a first step height is defined between the first vertical height and the third vertical height and a second step height is defined between second vertical height and the fourth vertical height, wherein the first step height is at least about 5% higher than the second step height. In an embodiment, a first metal silicide layer is on the third source/drain structures and a second metal silicide layer on the fourth source/drain structures, wherein the first metal silicide layer has a contact surface area greater than a contact surface area of the second metal silicide layer. In an embodiment, a first and a second conductive features is formed on the first and the second metal silicide layers respectively. In an embodiment, the third source/drain structure has a surface area greater than a surface area of the fourth source/drain structure. In an embodiment, the first vertical height of the first source/drain structure is about 8% and about 20% greater than the second vertical height of the second source/drain structure. In an embodiment, the first group of source/drain structures comprises n-type epi-material, and the second group of the source/drain structures comprises p-type epi-material.

In another embodiment, a semiconductor device includes a first active area and a second active area on a substrate, wherein the first active area comprises a first source/drain structure formed over a first fin structure, and the second active area comprises a second source/drain structure over a second fin structure, a gate structure over the first and the second fin structures, the first and second source/drain structures being proximate the gate structure, a first metal silicide layer on the first source/drain structure in the first active area, a second metal silicide layer on the second source/drain structure in the second active area and a first and second conductive features on the first and the second metal silicide layers respectively, wherein the first metal silicide layer has a first contact surface area to the conductive feature greater than a second contact surface area of the second metal silicide layer to the conductive feature. In an embodiment, the first source/drain structure has a first surface area contacting the first metal silicide layer greater than a second surface area of the second source/drain structure contacting the second metal silicide layer. In an embodiment, the second source/drain structure in the second active area has a second vertical height greater than a first vertical height of the first source/drain structure in the first active area. In an embodiment, a third source/drain structure is formed neighboring the first source/drain structure in the first active area and a fourth source/drain structure is formed neighboring the second source/drain structure in the second active area, wherein the third source/drain structure has a third vertical height greater than a fourth vertical height of the fourth source/drain structure. In an embodiment, a first step height is defined between the third vertical height and the first vertical height in the first active area and a second step height is defined between the fourth vertical height and the second vertical height in the second active area, wherein the first step height is at least about 5% higher than the second step height.

In yet another embodiment, a method for forming a semiconductor device includes etching a first and a second source/drain structures on a first and a second fin structures in a first and a second active region, respectively, on a substrate by an etching gas mixture including a sulfur containing passivation gas, wherein the etching gas mixture etches the first source/drain structure at a faster etching rate than etching the second source/drain structure, the etching forming the first source/drain structure in the first active region having a first vertical height less than a second vertical height formed in the second source/drain structure in the second active region. In an embodiment, the sulfur containing passivation gas selectively reacts with the second source/drain structure in the second active region, forming a passivation layer on the second source/drain structure while patterning the first source/drain structure in the first active region. In an embodiment, the sulfur containing passivation gas is carbonyl sulfide. In an embodiment, prior to etching the first and the second source/drain structures, a third source/drain structure is formed neighboring the first source/drain structure in the first active region, and a fourth source/drain structure is formed neighboring the second source/drain structure in the second active region, wherein the third source/drain structure has a third vertical height greater than a fourth vertical height of the fourth source/drain structure. In an embodiment, a first step height is defined between the third vertical height and the first vertical height in the first active area, and a second step height is defined between the fourth vertical height and the second vertical height in the second active area, wherein the first step height is at least about 5% higher than the second step height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
 a first group of source/drain structures on a first group of fin structures on a substrate;
 a second group of source/drain structures on a second group of fin structures on the substrate; and
 a first gate structure and a second gate structure over the first and the second group of fin structures, respectively, the first and second groups of source/drain structures being proximate the first and second gate structures, respectively, wherein the first group of source/drain structures on the first group of fin structures has a first source/drain structure and a third source/drain structure, the first source/drain structure having a first vertical height different from a second vertical height of a second source/drain structure of the second group of source/drain structures on the second group of fin structures, wherein the third source/drain structure having a third vertical height less than the first vertical height of the first source/drain structure.

2. The semiconductor device of claim 1, wherein the second group of the source/drain structures further comprises:
a fourth source/drain structure having a fourth vertical height less than the second vertical height of the second source/drain structure.

3. The semiconductor device of claim 2, wherein the third vertical height of the third source/drain structure is less than the fourth vertical height of the fourth source/drain structure.

4. The semiconductor device of claim 2, further comprising:
a first step height defined between the first vertical height and the third vertical height; and
a second step height defined between second vertical height and the fourth vertical height, wherein the first step height is at least about 5% higher than the second step height.

5. The semiconductor device of claim 2, further comprising:
a first metal silicide layer on the third source/drain structure; and
a second metal silicide layer on the fourth source/drain structure, wherein the first metal silicide layer has a contact surface area greater than a contact surface area of the second metal silicide layer.

6. The semiconductor device of claim 5, further comprising:
a first and a second conductive features formed on the first and the second metal silicide layers respectively.

7. The semiconductor device of claim 2, wherein the third source/drain structure has a surface area greater than a surface area of the fourth source/drain structure.

8. The semiconductor device of claim 1, wherein the first vertical height of the first source/drain structure is about 8% and about 20% greater than the second vertical height of the second source/drain structure.

9. The semiconductor device of claim 1, wherein the first group of source/drain structures comprises n-type epi-material, and the second group of the source/drain structures comprises p-type epi-material.

10. A semiconductor device, comprising:
a first source/drain structure over a first fin structure, a second source/drain structure over a second fin structure, a third source/drain structure over a third fin structure, and a fourth source/drain structure over a fourth fin structure, wherein the first source/drain structure has a first vertical height, the second source/drain structure has a second vertical height, the third source/drain structure has a third vertical height, and the fourth source/drain structure has a fourth vertical height, the first source/drain structure and the third source/drain structure having a first conductivity type, the second source/drain structure and the fourth source/drain structure having a second conductivity type, wherein the third vertical height different from the fourth vertical height, wherein the first vertical height is less than the third vertical height, wherein the second vertical height is less than the third vertical height;
a first metal silicide layer on the first source/drain structure;
a second metal silicide layer on the second source/drain structure; and
a first and second conductive features on the first and the second metal silicide layers, respectively, wherein the first metal silicide layer has a first contact surface area to the first conductive feature greater than a second contact surface area of the second metal silicide layer to the second conductive feature.

11. The semiconductor device of claim 10, wherein the first vertical height of the third source/drain structure is about 8% and about 20% greater than the fourth vertical height of the second source/drain structure.

12. The semiconductor device of claim 10, wherein the first vertical height is less than the second vertical height.

13. The semiconductor device of claim 12, wherein a first step height between the first source/drain structure and the third source/drain structure is greater than a second step height between the second source/drain structure and the fourth source/drain structure.

14. The semiconductor device of claim 10, wherein the first metal silicide layer extends along a sidewall of the first source/drain structure.

15. A semiconductor device, comprising:
a first group of source/drain structures on a first group of fin structures on a substrate, the first group of source/drain structures comprising:
a first source/drain structure having a first vertical height; and
a second source/drain structure having a second vertical height greater than the first vertical height;
a second group of source/drain structures on a second group of fin structures on the substrate, the second group of source/drain structures comprising:
a third source/drain structure having a third vertical height greater than the first vertical height; and
a fourth source/drain structure having a fourth vertical height less than the second vertical height and greater than the third vertical height;
a first gate structure and a second gate structure over the first and the second group of fin structures, respectively, the first and second groups of source/drain structures being proximate the first and second gate structures, respectively;
a first metal silicide layer on the first source/drain structure;
a second metal silicide layer on the third source/drain structure; and
a first and second conductive features on the first and the second metal silicide layers, respectively, wherein the first metal silicide layer has a first contact surface area to the first conductive feature greater than a second contact surface area of the second metal silicide layer to the second conductive feature.

16. The semiconductor device of claim 15, wherein a first step height defined between the first vertical height and the second vertical height is at least 5% higher than a second step height defined between the third vertical height and the fourth vertical height.

17. The semiconductor device of claim 15, wherein a ratio of a first step height defined between the first vertical height and the second vertical height to a second step height defined between the third vertical height and the fourth vertical height is about 1.1.

18. The semiconductor device of claim 15, wherein the first group of source/drain structures are in an n-type region and the second group of source/drain structures are in a p-type region.

19. The semiconductor device of claim 15, wherein a ratio of the second vertical height to the fourth vertical height is greater than 1.1.

20. The semiconductor device of claim 1, further comprising a silicide layer extending along a sidewall of the third source/drain structure.

* * * * *